United States Patent
Iwai et al.

(10) Patent No.: US 8,743,546 B2
(45) Date of Patent: Jun. 3, 2014

(54) SHEET STRUCTURE AND METHOD OF MANUFACTURING THE SAME

(75) Inventors: Taisuke Iwai, Kawasaki (JP); Daiyu Kondo, Kawasaki (JP); Yoshitaka Yamaguchi, Kawasaki (JP); Ikuo Soga, Kawasaki (JP); Shinichi Hirose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 443 days.

(21) Appl. No.: 12/255,450

(22) Filed: Oct. 21, 2008

(65) Prior Publication Data

US 2010/0027221 A1 Feb. 4, 2010

(30) Foreign Application Priority Data

Oct. 22, 2007 (JP) ................................. 2007-273584
Sep. 19, 2008 (JP) ................................. 2008-241413

(51) Int. Cl.
*H05K 7/20* (2006.01)
*B32B 3/00* (2006.01)
*B05D 5/12* (2006.01)
*B32B 37/00* (2006.01)
*D01F 9/12* (2006.01)

(52) U.S. Cl.
USPC ............. 361/711; 428/173; 427/58; 156/182; 423/447.1

(58) Field of Classification Search
USPC ............... 361/704–708, 711; 423/447.1–447; 427/58; 156/182; 428/173
See application file for complete search history.

(56) References Cited

U.S. PATENT DOCUMENTS

| | | | |
|---|---|---|---|
| 6,311,769 B1 | 11/2001 | Bonneville et al. | |
| 6,407,922 B1 | 6/2002 | Eckblad et al. | |
| 2003/0117770 A1 | 6/2003 | Montgomery | |
| 2004/0265489 A1 | 12/2004 | Dubin | |
| 2004/0265755 A1* | 12/2004 | Park et al. | 430/322 |
| 2005/0145367 A1 | 7/2005 | Hannah et al. | |
| 2006/0219689 A1 | 10/2006 | Huang et al. | |
| 2006/0234056 A1* | 10/2006 | Huang et al. | 428/408 |
| 2007/0004081 A1 | 1/2007 | Hsiao | |
| 2007/0134599 A1 | 6/2007 | Raravikar et al. | |
| 2007/0155136 A1* | 7/2007 | Chrysler et al. | 438/478 |
| 2007/0244245 A1 | 10/2007 | Liu et al. | |

(Continued)

FOREIGN PATENT DOCUMENTS

CN 1891780 A 1/2007
JP 9-129793 A 5/1997

(Continued)

OTHER PUBLICATIONS

Fan, et al., Self-Oriented Regular Arrays of Carbon Nanotubes and Their Field Emission Properties, Science 1999; 283: 512-514.*

(Continued)

*Primary Examiner* — Daniel C McCracken
(74) *Attorney, Agent, or Firm* — Westerman, Hattori, Daniels & Adrian, LLP

(57) ABSTRACT

The sheet structure includes a plurality of linear structure bundles 12 each of which comprises a plurality of linear structures of carbon atoms arranged, spaced from each other at a first gap and which are arranged at a second gap which is larger than the first gap; and a filling layer 14 filled in the first gap and the second gap and supporting the plurality of linear structure bundles 12.

12 Claims, 28 Drawing Sheets

(56) References Cited

U.S. PATENT DOCUMENTS

| | | | | |
|---|---|---|---|---|
| 2007/0261140 | A1* | 11/2007 | Liang | 977/876 |
| 2009/0016951 | A1* | 1/2009 | Kawabata et al. | 423/447.2 |
| 2010/0243227 | A1 | 9/2010 | Wu et al. | |

FOREIGN PATENT DOCUMENTS

| | | | | |
|---|---|---|---|---|
| JP | 9-321190 | A | 12/1997 | |
| JP | 2002-93969 | A | 3/2002 | |
| JP | 2003-163314 | A | 6/2003 | |
| JP | 2003-249613 | A | 9/2003 | |
| JP | 2004-207690 | A | 7/2004 | |
| JP | 2005-116839 | A | 4/2005 | |
| JP | 2005-150362 | A | 6/2005 | |
| JP | 2006-128571 | A | 5/2006 | |
| JP | 2006-147801 | A | 6/2006 | |
| JP | 2006-287179 | A | 10/2006 | |
| JP | 2006-297549 | A | 11/2006 | |
| JP | 2006-303240 | A | 11/2006 | |
| JP | 2007-009213 | A | 1/2007 | |
| JP | 2007-284679 | A | 11/2007 | |
| WO | 2007/111107 | * | 10/2007 | D01F 9/127 |
| WO | 2007-111107 | A1 | 10/2007 | |

OTHER PUBLICATIONS

"Thermal Conductivity of Metals," accessed online at <http://www.engineeringtoolbox.com/thermal-conductivity-metals-d_858.html> on Jan. 9, 2012.*

European Search Report dated Nov. 5, 2009, issued in corresponding European Patent Application No. 08167274.3.

European Office Action dated Feb. 2, 2011, issued in corresponding European Patent Application No. 08 167 274.3.

Japanese Office Action mailed May 29, 2012, issued in corresponding Japanese Patent Application No. 2008-241413, w/ English translation.

Japanese Office Action mailed Apr. 23, 2013, issued in corresponding Japanese Patent Application No. 2012-167223, w/ English translation.

Notification of Reasons for Refusal dated Oct. 29, 2013, issued in Japanese application No. 2012-167223, w/ English translation.

Japanese Office Action dated Feb. 12, 2014, issued in corresponding Japanese Patent Application No. 2012-167223, w/English translation (2 pages).

Japanese Decision of Dismissal of Amendment dated Feb. 12, 2014, issued in corresponding Japanese Patent Application No. 2012-167223 (4 pages).

* cited by examiner

SHEET STRUCTURE AND METHOD OF MANUFACTURING THE SAME

CROSS REFERENCE TO RELATED APPLICATIONS

This application is based upon and claims the benefit of priorities from the prior Japanese Patent Application No. 2007-273584, filed on Oct. 22, 2007, and the prior Japanese Patent Application No. 2008-241413, filed on Sep. 19, 2008, the entire contents of which are incorporated herein by reference.

FIELD

The present invention relates to a sheet structure and a method of manufacturing the same, more specifically, a sheet structure comprising a linear structure of carbon atoms oriented vertical to the sheet surface and its manufacturing method, and an electronic instrument using such the sheet structure.

BACKGROUND

The electronic parts used in the CPUs (Central Processing Units), etc. of servers, personal computers, etc. are needed to have high radiation efficiency of heat generated by semiconductor elements. For the effective radiation of the heat generated in the semiconductor elements, the structure that a heat spreader made of a material of a high specific thermal conductivity, such as copper or another, is disposed over the semiconductor element with a thermal conductive sheet, such as indium sheet or another, disposed immediately above the semiconductor element interposed therebetween.

However, due the recent large demand increase of rare metals, the price of indium has gone up, and substitute materials which are less expensive than indium are expected. In terms of the physical properties, it cannot be said that the specific thermal conductivity of indium (50 W/m·K) is high. To more effectively radiate the heat generated by the semiconductor elements, materials of higher thermal conductivities are expected.

In such background, as a material whose thermal conductivity is higher than indium, the linear structure of carbon atoms, which is typically the carbon nanotube is noted. The carbon nanotube not only has a very high thermal conductivity (1500 W/m·K) but also is superior in flexibility and heat resistance, and has high potential as a heat radiation material.

As a thermal conductive sheet using carbon nanotubes, a thermal conductive sheet including carbon nanotubes dispersed in a resin, a thermal conductive sheet including carbon nanotube bundles orientationally grown on a substrate, which are buried with a resin, etc. are proposed.

However, in the proposed thermal conductive sheets, the higher thermal conductivity of the carbon nanotube cannot be sufficiently utilized.

SUMMARY

According to one aspect of an embodiment, there is provided a sheet structure having: a plurality of linear structure bundles each of which has a plurality of linear structures of carbon atoms arranged, spaced from each other at a first gap and which are arranged at a second gap which is larger than the first gap; and a filling layer filled in the first gap and the second gap and supporting the plurality of linear structure bundles.

According to another aspect of an embodiment, there is provided a sheet structure having: a plurality of linear structure bundles each of which has a plurality of linear structures of carbon atoms arranged, spaced from each other at a first gap and which are arranged at a second gap which is larger than the first gap; and a filling layer filled in the first gap and the second gap and supporting the plurality of linear structure bundles, the plurality of linear structure bundles having those of a first group which are tapered with ends on one surface being smaller than ends on the other surface and those of a second group which are tapered with ends on said other surface being smaller than ends of said one surface.

According to further another aspect of an embodiment, there is provided an electronic instrument having: a sheet structure having: a plurality of linear structure bundles each of which has a plurality of linear structures of carbon atoms arranged, spaced from each other at a first gap and which are arranged at a second gap which is larger than the first gap; and a filling layer filled in the first gap and the second gap and supporting the plurality of linear structure bundles.

According to further another aspect of an embodiment, there is provided a method of manufacturing a sheet structure having: forming a catalytic metal film in a plurality of regions of a substrate, which are spaced from each other; forming a plurality of linear structure bundles having a plurality of linear structures of carbon atoms in the respective plurality of regions by growing liner structures of carbon atoms with the catalytic metal film as a catalyst; filling a filling material between the linear structure bundles and between the line structures to form a filling layer of the filling material; and removing the substrate.

According to further another aspect of an embodiment, there is provided a method of manufacturing a sheet structure having: forming on a first substrate first linear structure bundles in respective plural regions spaced from each other; forming on a second substrate second linear structure bundles in respective plural regions spaced from each other; bonding the first substrate and the second substrate to each other with a surface of the first substrate with the first linear structure bundles formed on and a surface of the second substrate with the second linear structure bundles formed on opposed to each other to thereby engage the first linear structure bundles and the second linear structure bundles with each other and to fill gaps; filling a filling material between the first linear structure bundles and the second linear structure bundles and between the linear structures to thereby form a filling layer; and removing the first substrate and the second substrate.

Additional objects and advantageous of the embodiment will be set forth in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

A First Embodiment

The carbon nanotube sheet and the method of manufacturing the same according to a first embodiment will be explained with reference to FIGS. 1 to 7D.

Figure 1A:
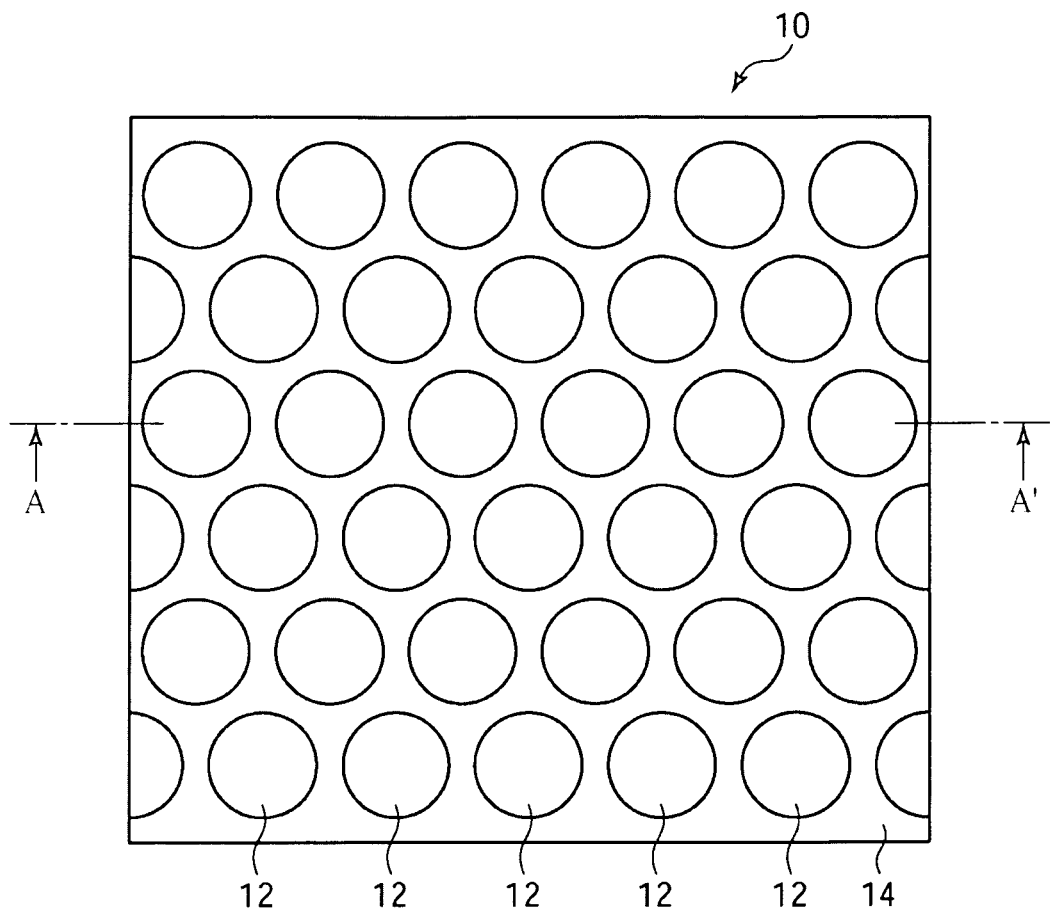
FIG. 1A is a plan view illustrating a structure of the carbon nanotube sheet according to a first embodiment of the present invention.
Figure 1B:
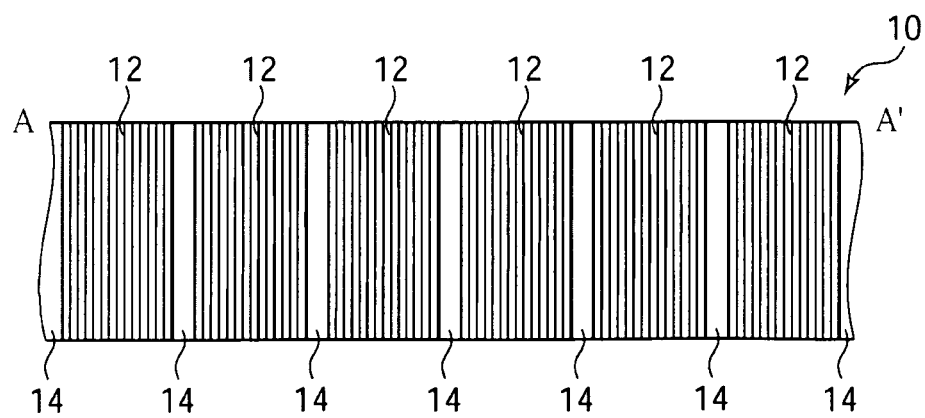
FIG. 1B is a diagrammatic sectional view illustrating the structure of the carbon nanotube sheet according to the first embodiment of the present invention.
Figure 2:
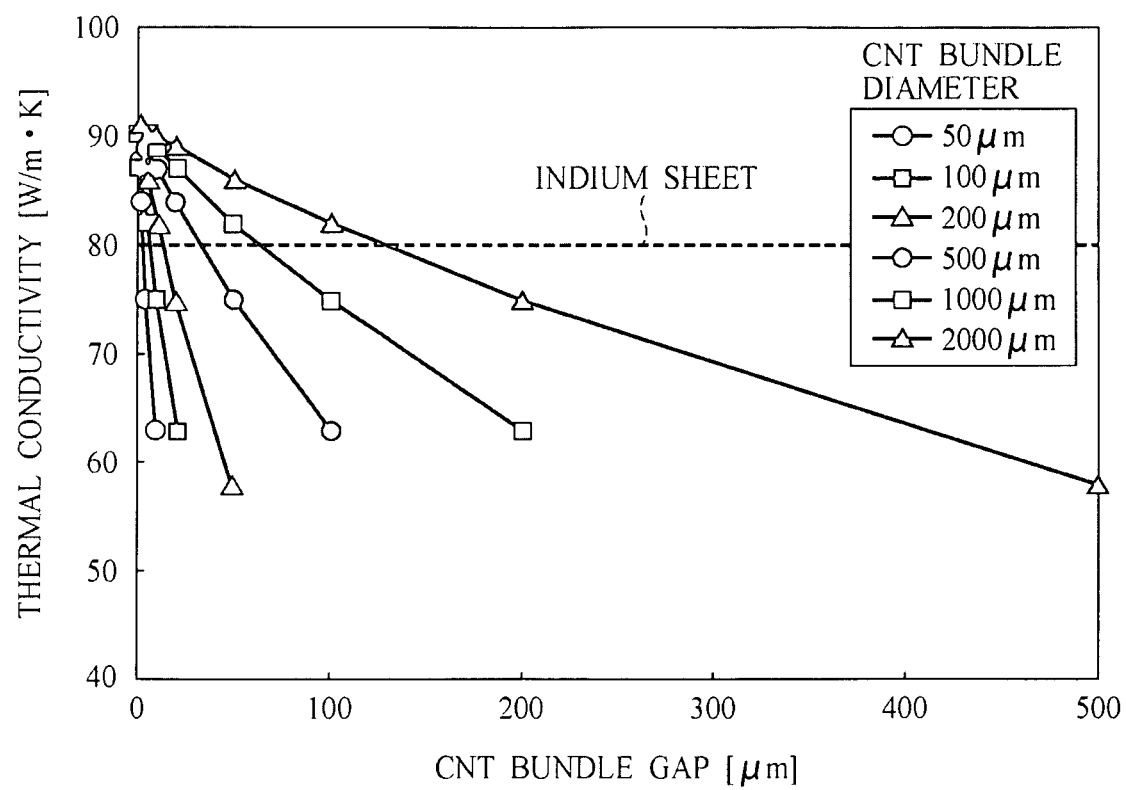
FIG. 2 is a graph illustrating a relationship between the thermal conductivity of the carbon nanotube sheet according to the first embodiment of the present invention and the gap of the carbon nanotube bundles.
Figure 3:
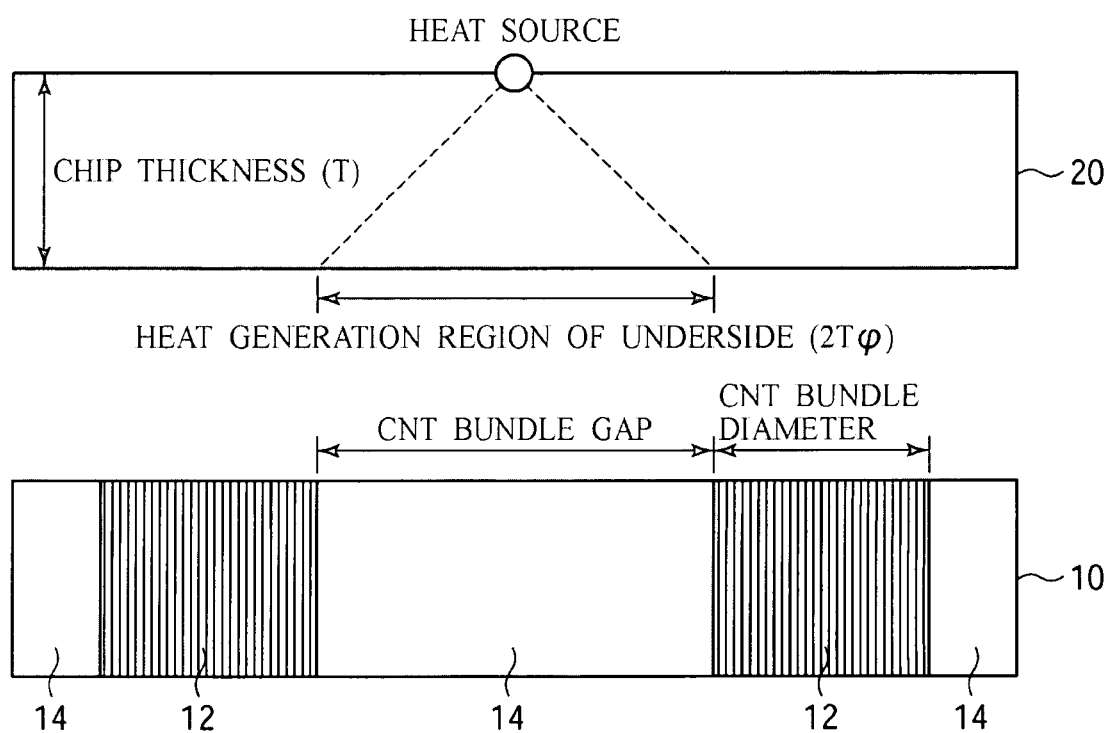
FIG. 3 is a view explaining the gap of the carbon nanotube bundles of the carbon nanotube sheet according to the first embodiment of the present invention.

FIGS. 1A and 1B are a plan view and a diagrammatic sectional view illustrating a structure of the carbon nanotube sheet according to the present embodiment. FIG. 2 is a graph illustrating a relationship between the thermal conductivity of the carbon nanotube sheet according to the present embodiment. FIG. 3 is a view explaining the gap of the carbon nanotube bundles of the carbon nanotube sheet according to the present embodiment. FIGS. 4A-4E are plan views illustrating configurations of the carbon nanotube bundles of the carbon nanotube sheet according to the present embodiment. FIGS. 5A-5D are diagrammatic sectional views illustrating the structures of the carbon nanotube sheet according to the present embodiment. FIGS. 6A-7D are sectional views illustrating a method of manufacturing the carbon nanotube sheet according to the present embodiment.

First, the structure of the carbon nanotube sheet according to the present embodiment will be explained with reference to FIGS. 1A and 1B.

As illustrated in FIG. 1A, the carbon nanotube sheet 10 according to the present embodiment has the structure that a plurality of carbon nanotube bundles 12 are arranged at a gap from each other, and the gaps are filled with a filling layer 14 of a resin material or another.

As illustrated in FIG. 1B, each carbon nanotube bundle 12 is formed, extended perpendicularly to the surface of the sheet and contains a plurality of carbon nanotubes oriented vertically to the surface of the sheet. The carbon nanotube can be a single-walled carbon nanotube or a multi-walled carbon nanotube. The density of the carbon nanotubes contained in the carbon nanotube bundle 12 is not especially limited but can be set preferably at not less than about $1 \times 10^{10}$ tubes/cm$^2$ from the view point of heat radiation and electric conduction.

The length of the carbon nanotube bundle 12 (the thickness of the sheet) is decided by applications of the carbon nanotube sheet 10. It is not especially limited but can be set preferably at a value of about 5-500 μm.

In the carbon nanotube sheet 10 according to the present embodiment, gaps are formed between the carbon nanotube bundles 12, and the filling layer 14 is formed in the gaps. This is for improving the permeability of a filling material to be the filling layer 14, suppressing the configuration changes, such as horizontal falls, etc. to retain the original orientation of the carbon nanotubes (refer to the manufacturing method which will be described later).

The gap required between the carbon nanotube bundles 12 varies depending on the viscosity, etc. of the filling material to be the filling layer 14 and cannot be unconditionally decided. The gap can be set at a width sufficiently larger than a gap between the carbon nanotubes forming each carbon nanotube bundle 12, preferable at a value of about 0.1-200 μm. However, as the gap between the carbon nanotube bundles 12 is larger, the surface density of the carbon nanotubes in the sheet surface decreases, i.e., the thermal conductivity of the sheet decreases. The surface density of the carbon nanotubes in the sheet surface varies, also depending on a size of the carbon nanotube bundles 12. Accordingly, the gap between the carbon nanotube bundles 12 can be set suitably for a thermal conductivity required for the sheet in consideration of a size of the carbon nanotube bundles 12.

FIG. 2 is a graph of one of the relationships between the thermal conductivity of the sheet, and the size and the gap of the carbon nanotube bundles 12. FIG. 2 shows the result of the calculation made for carbon nanotube bundles 12 formed in a region of the plane pattern in which the circles are arranged in the close-packed type as illustrated in FIG. 1A with the carbon nanotube density in the carbon nanotube bundle 12 being $1 \times 10^{11}$ tubes/cm$^2$ and the thermal conductivity of the carbon nanotube per one tube being 1000 W/m·K. The size of the carbon nanotube bundles (CNT bundle) 12 is a diameter of a circles in the region where the carbon nanotube bundle 12 is formed. The gap of the carbon nanotube bundles 12 is a minimum distance between the circles of the region where the carbon nanotube bundles 12 are formed and their adjacent circles. In the graph, the dotted line indicates the thermal conductivity of the conventionally used indium sheet.

As shown in FIG. 2, the thermal conductivity of the carbon nanotube sheet 10 largely depends on the size and the gap of the carbon nanotube bundles 12 and increases as the size of the carbon nanotube bundles 12 is larger and as the gap of the carbon nanotube bundles 12 is smaller.

For the carbon nanotube sheet 10 of FIG. 2, to obtain the carbon nanotube sheet 10 of the thermal conductivity equal to the indium sheet or higher (about 80 W/m·K), it is necessary to set the gap of the CNT bundles at not more than about 4 μm when the diameter of the CNT bundles 12 is 50 μm, at not more than about 7 μm when the diameter of the CNT bundles 12 is 100 μm, at not more than about 14 μm when the diameter of the CNT bundles 12 is 200 μm, at not more than about 36 μm when the diameter of the CNT bundles 12 is 500 μm, at not more than about 72 μm when the diameter of the CNT bundles 12 is 1000 μm, and at not more than about 151 μm when the diameter of the CNT bundles 12 is 2000 μm.

When the semiconductor chip of a CPU or another as the heat generator is considered, during the operation of the semiconductor chip, the whole chip does not generate heat but generates heat at the hot spot (heat generation source) as the center. As illustrated in FIG. 3, when the hot spot is located near the surface of the chip 20, the heat generating region of the chip 10 underside, where heat is generated by the heat spot, is a 2Tφ region when the thickness of the chip 20 is T. For example, the thickness of the chip 20 is 100 μm, the heat generating region of the underside will be about 200 μm. At this time, for the radiation from the underside of the chip 20, it is preferable that the carbon nanotube bundles 12 to be the radiation path is present essentially in the 200 μmφ region. In consideration that it is rare the chip thickness is smaller than 100 μm, preferably, the gap of the carbon nanotube bundles 12 is set at not more than 200 μm.

The plane shape of the respective carbon nanotube bundles 12 is not limited to the circle illustrated in FIG. 1A. The plane shape of the carbon nanotube bundles 12 can be polygons other than circular, e.g., triangle, quadrangle, hexagon, etc.

Figure 4A:
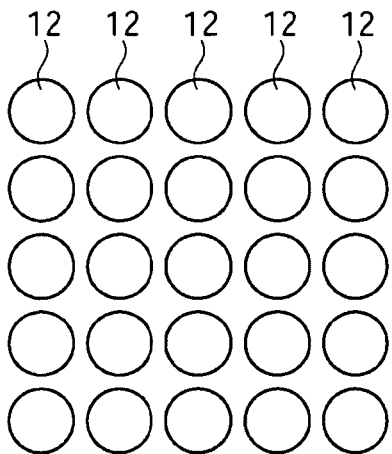
FIGS. 4A-4E are plan views illustrating configurations of the carbon nanotube bundles of the carbon nanotube sheet according to the first embodiment of the present invention.
Figure 4B:
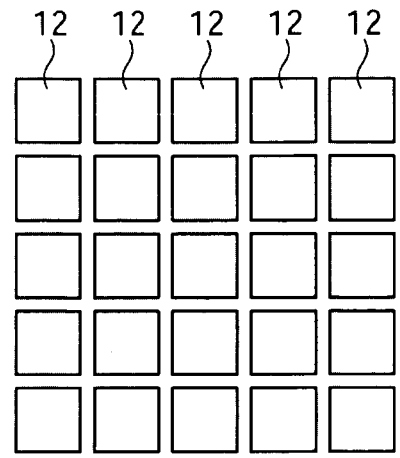
Figure 4C:
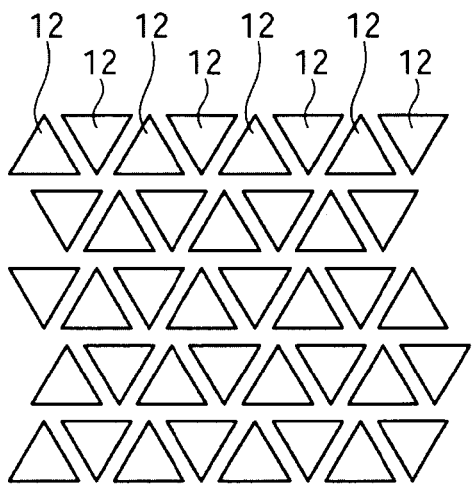
Figure 4D:
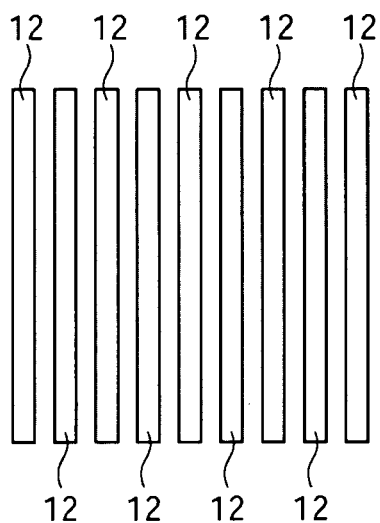
Figure 4E:
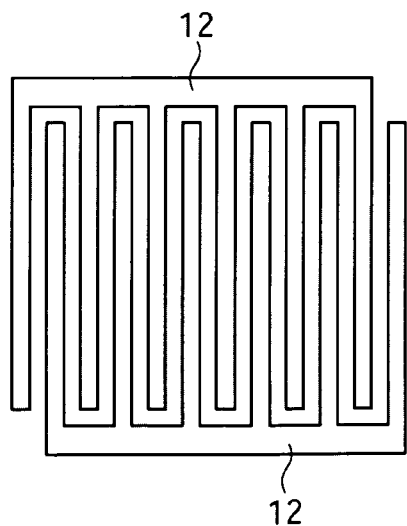

The layout of a plurality of the carbon nanotube bundles 12 is not limited to the circular close-packed layout as illustrated in FIG. 1A. For example, as illustrated in FIGS. 4A and 4B, the carbon nanotube bundles 12 may be laid out at the respective lattice points of the tetragonal lattice. As illustrated in FIG. 4C, the carbon nanotube bundles 12 of a triangular plane shape may be arranged upside down with respect to the adjacent one in each row. As illustrated in FIG. 4D, the carbon nanotube bundles 12 may be arranged in the stripe pattern. As illustrated in FIG. 4E, the carbon nanotube bundles 12 may be arranged in a comb-pattern.

In the carbon nanotube sheet 16 according to the present embodiment, the carbon nanotube bundles 12 have the upper ends and the lower ends not covered by the filling layer 14, whereby when the carbon nanotube sheet 10 is brought into contact with a heat radiator or a heat generator, the carbon nanotube bundles 12 are in direct contact with the heat radiator or the heat generator, which can largely improve the thermal conductivity.

The carbon nanotube also has electric conductivity, and the carbon nanotube bundles 12 have the upper ends and the lower ends exposed, which makes it possible to use the carbon nanotube bundles 12 also as interconnections passed through the sheet. That is, the carbon nanotube sheet 10 according to the present embodiment can be used not only as a thermal conductive sheet but also as the vertical interconnecting sheet.

Figure 5A:
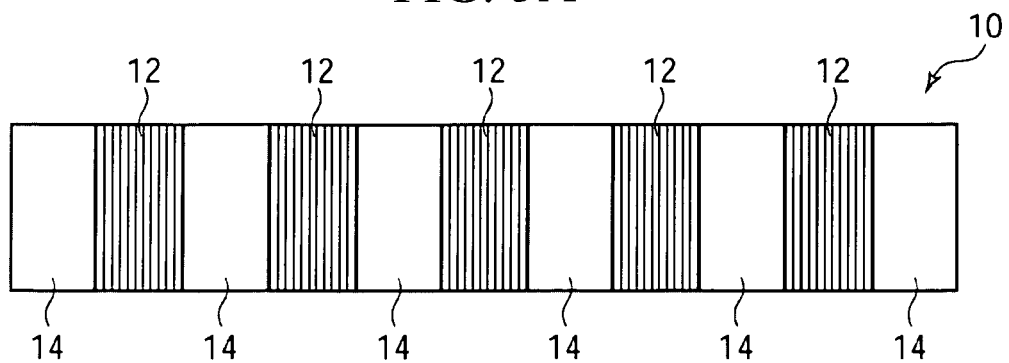
FIGS. 5A-5D are diagrammatic sectional views illustrating structures of the carbon nanotube sheet according to the first embodiment of the present invention.
Figure 5B:
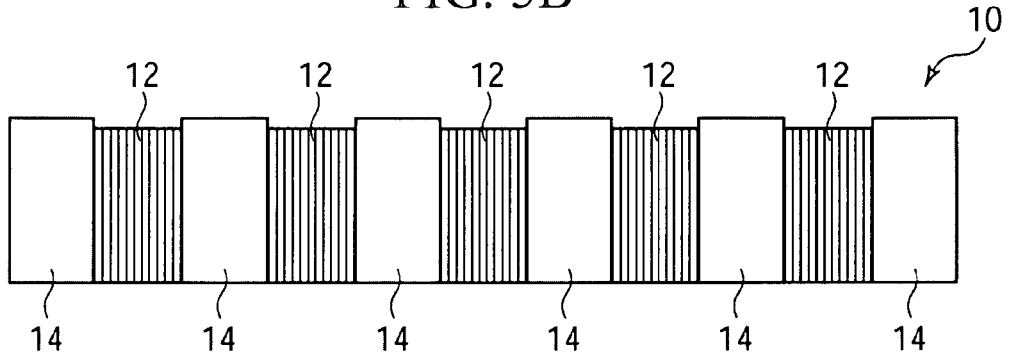
Figure 5C:
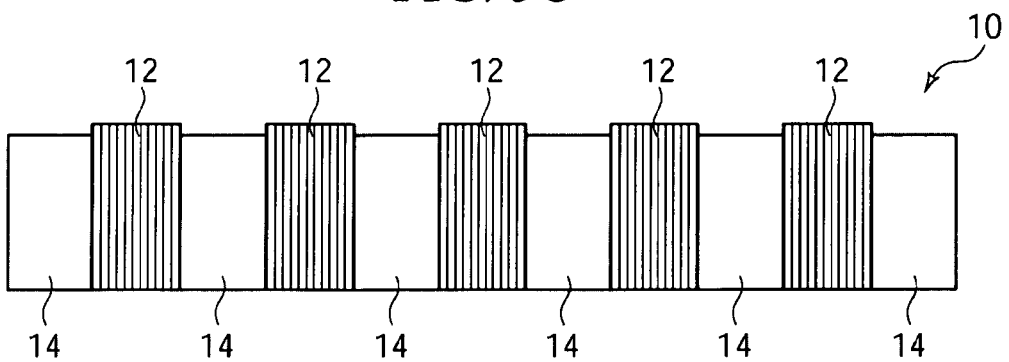

The height of the carbon nanotube bundles 12 and the thickness of the filling layer 14 (both are thickness-wise lengths of the sheet) may be the same, as illustrated in FIG. 5A. As illustrated in FIG. 5B, one ends of the carbon nanotube bundles 12 may be lower than the surface of the filling layer 14. As illustrated in FIG. 5C, one ends of the carbon nanotube bundles 12 may be higher than the surface of the filling layer 14. Such configurations can be respectively formed by varying the material of the filling layer 14 and forming conditions (refer to the manufacturing method described below).

The configuration of FIG. 5B is expected to mitigate stresses exerted to the carbon nanotube bundles 12 by the filling layer 14 when the carbon nanotube sheet 10 is arranged between a heat radiator and a heat generator in press-contact therewith. On the other hand, the configuration of FIG. 5C is expected to improve the close contact of the carbon nanotube bundles 12 to the heat radiator and the heat generator to improve the thermal conductivity. Preferably, the relationship between the height of the carbon nanotube bundles 12 and the thickness of the filling layer 14 is set suitably in accordance with applications of the carbon nanotube sheet 10 and stresses, etc. exerted to the carbon nanotube sheet 10.

Figure 5D:
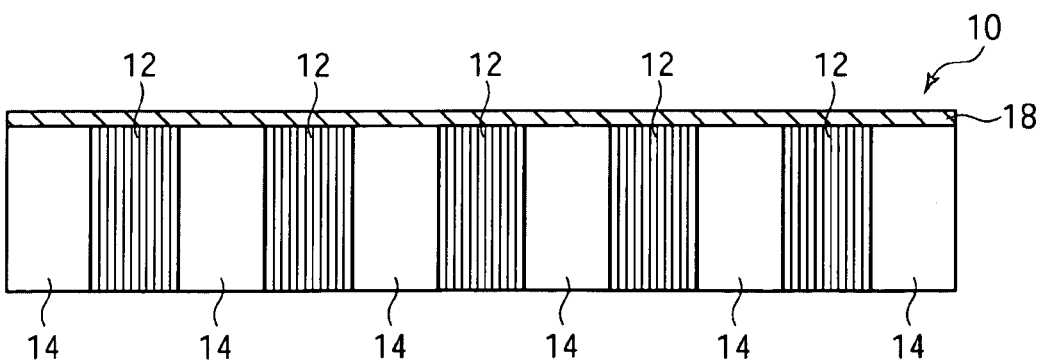

As shown in FIG. 5D, a coating film 18 connected to the ends of the carbon nanotube bundles 12 may be provided on at least one surface of the carbon nanotube sheet 10. The coating film 18 is not especially limited as long as the coating film 18 is formed of a material whose thermal conductivity is higher than that of the material forming the filling layer 14. When the carbon nanotube sheet 10 is used for electric conduction, a material having electric conductivity, e.g., a metal, an alloy or others can be used. As the constituent material of the coating film 18, copper (Cu), nickel (Ni), gold (Au) or others, can be used. The coating film 18 may not have essentially a single layer structure and may have a two-layer structure, or a three- or more-layer structure, e.g., the layer structure of titanium (Ti) and gold (Au).

The film thickness of the coating film 18 is not especially limited. Preferably, the film thickness of the coating film is suitably decided, depending on characteristics required of the carbon nanotube sheet 10 and a constituent material of the coating film 18.

The coating film 18 of high thermal conductivity is provided, whereby the contact area of the carbon nanotube sheet 10 with respect to a mounted body (a heat radiator or a heat generator) can be increased with respect to the carbon nanotube sheet 10 without the coating film 18. Thus, the thermal contact resistance between the carbon nanotube bundles 12 and the mounted body is deceased, and the thermal conductivity of the carbon nanotube sheet 10 can be increased. In using the carbon nanotube sheet 10 as a conductive sheet, the electric conductivity can be increased.

In the carbon nanotube sheet 10 illustrated in FIG. 5D, the coating film 18 is formed on one surface of the carbon nanotube sheet 10 illustrated in FIG. 5A, but the coating film 18 may be formed on both surfaces of the carbon nanotube sheet 10. The coating film 18 may be formed on one surface or both surfaces of the carbon nanotube sheet 10 illustrated in FIG. 5B or FIG. 5C.

The constituent material of the filling layer 14 is not especially limited as long as the material has the property that the material is liquid when filling the spaces between the carbon nanotubes and can be hardened later. To give examples, as the organic filling materials, acryl resin, epoxy resin, silicone resin, polyimide resin, etc. can be used. As the inorganic filling materials, insulating film forming compositions by using spin coating, such as SOG (Spin On Glass), etc., can be used. Metal materials, such as indium, solder, metal pastes (e.g., silver paste), etc., can be also used. Conductive polymers, such as polyaniline, polythiophene, etc., can be used.

To the filling layer 14, an additive may be mixed as required. As the additive, a highly thermally conductive material or a highly electrically conductive material, for example, is considered. A highly thermally conductive additive is mixed in the filling layer 14, whereby the thermal conductivity of a part of the filling layer 14 can be improved, and the thermal conductivity of the carbon nanotube sheet as a whole can be improved. When the carbon nanotube sheet 10 is used as an electrically conductive sheet, a highly electrically conductive additive is mixed in the filer layer 14, whereby the electrical conductivity of a part of the filling layer 14 can be improved, and the electric conductivity of the carbon nanotube sheet 10 as a whole can be improved. This is especially effective when a low thermally conductive insulating material, such as an organic filling material or another, for example, is used as the filling layer 14. As the highly thermally conductive material, carbon nanotube, a metal material, aluminum nitride, silica, alumina, graphite, fullerene or others can be used. As the highly electrically conductive material, carbon nanotube, a metal material, etc. can be used.

When the filling layer 14 is formed of a reflowable material, in addition to the effects of improving the thermal conductivity and/or the electrical conductivity of the carbon nanotube sheet 10, the coating film 18 also exhibits an effect for suppressing the carbon nanotubes of the carbon nanotube bundles 12 to loose.

Next, the method of manufacturing the carbon nanotube sheet according to the present embodiment will be explained with reference to FIGS. 6A to 7D.

Figure 6A:
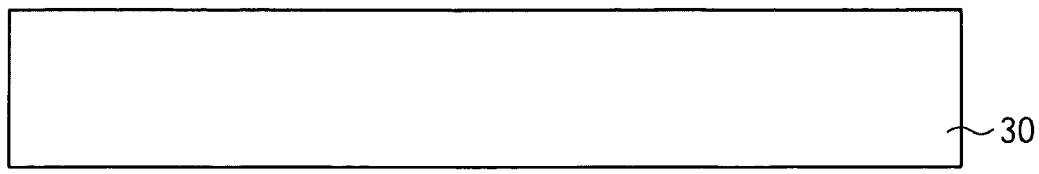
FIGS. 6A-6D and 7A-7D are sectional views illustrating a method of manufacturing the carbon nanotube sheet according to the first embodiment of the present invention.

First, a substrate 30 to be used as the base for forming the carbon nanotube sheet 10 is prepared (FIG. 6A). As the substrate 30, a semiconductor substrate, such as a silicon substrate or another, an alumina (sapphire) substrate, an MgO substrate, a glass substrate or another can be used. Such substrates may have thin film formed on. For example, a silicon substrate with an about 300 nm-thickness silicon oxide film formed on can be used.

The substrate 30 is to be peeled after the carbon nanotube sheet 10 has been formed. For this use of the substrate 30, it is preferable that the substrate 30 has at least the surface to contact the carbon nanotube sheet 10 is formed of a material which is easily peelable from the carbon nanotube sheet 10 or a material which can be selectively etched with respect to the carbon nanotube sheet 10.

Specifically, when acryl resin is used as the material of the filling layer 14, a material which is less adhesive to acryl resin, e.g., silicon oxide film, silicon nitride film or another is formed, whereby the carbon nanotube sheet 10 can be easily peeled. Otherwise, the surface of the substrate 30 is formed of a material, such as silicon oxide film, silicon nitride film or another, which can be selectively etched with respect to the carbon nanotube sheet 10, whereby the film is etched off, and the carbon nanotube sheet 10 can be released from the substrate 30.

Figure 6B:
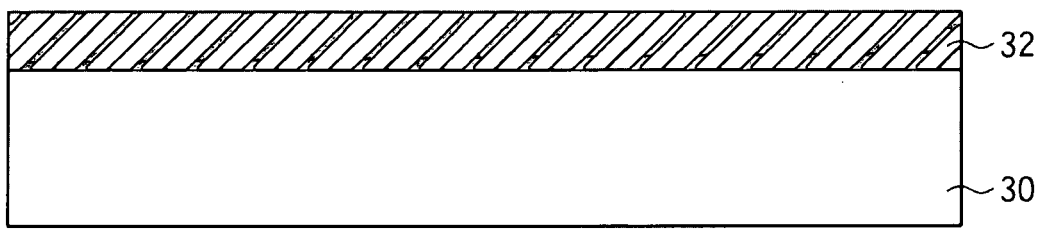

Then, on the substrate 30, a photoresist film 32 is formed by spin coating method (FIG. 6B).

Figure 6C:
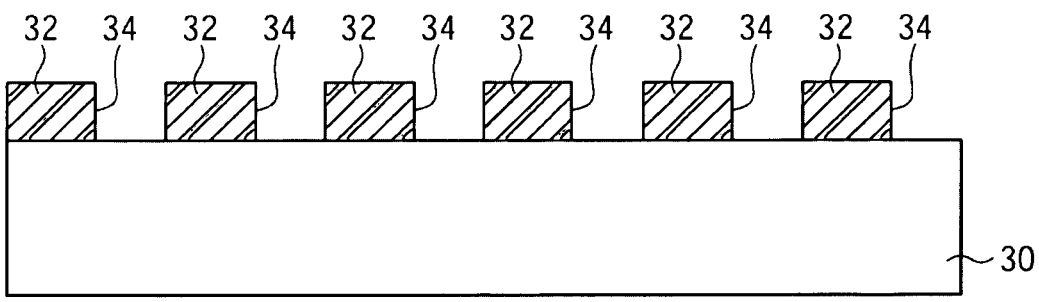

Then, in the photoresist film 32, openings 34 exposing the regions for the carbon nanotube bundles 12 to be formed in are formed by photolithography (FIG. 6C). The pattern of the openings 34 is the pattern of, e.g., FIG. 1A. The diameter of the openings 34 (the diameter of the region for the carbon nanotube bundles 12 to be formed in) is, e.g., 100 μm, and the gap between the openings 34 (the gap between the carbon nanotube bundles 12) is, e.g., 20 μm. The pattern of the openings formed in the photoresist film 32 can be various patterns illustrated in, e.g., FIGS. 4A to 4E other than the pattern of FIG. 1A.

Figure 6D:
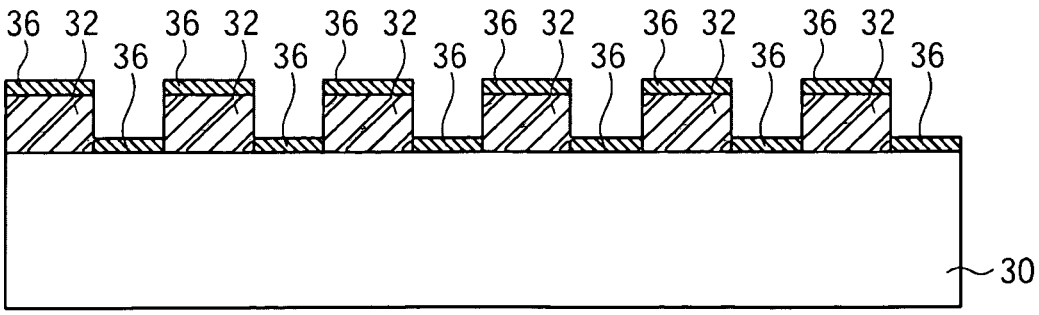

Then, a 2.5 nm-thickness Fe (iron) film, for example, is formed by, e.g., sputtering method to form a catalytic metal film 36 of Fe (FIG. 6D). The catalytic metal film 36 is formed on the photoresist film 32 and on the substrate 30 in the openings 34.

As the catalytic metal, Co (cobalt), Ni (nickel), Au (gold), Ag (silver), Pt (platinum) or an alloy containing at least one of them can be used other than Fe. As the catalyst, metal particles formed with a size controlled in advance with a DMA (Differential Mobility Analyzer) or others can be used other than the metal film. In this case as well, the metal species can be the same as that of the thin film.

As the base film of such catalytic metal, a film of Mo (molybdenum), Ti (titanium), Hf (hafnium), Zr (zirconium), Nb (niobium), V (vanadium), TaN (tantalum nitride), $TiSi_x$ (titanium silicide), Al (aluminum), $Al_2O_3$ (aluminum oxide), $TiO_x$ (titanium oxide), Ta (tantalum), W (tungsten), Cu (copper), Au (gold), Pt (platinum), Pd (palladium), TiN (titanium nitride) or an alloy containing at least one of them may be formed. For example, the layer structure of Fe (2.5 nm)/Al (10 nm), the layer structure of Co (2.6 nm)/TiN (5 nm), etc. can be used. When the metal particles are used, the layer structure of, e.g., Co (average diameter: 3.8 nm)/TiN (5 nm) can be used.

Figure 7A:
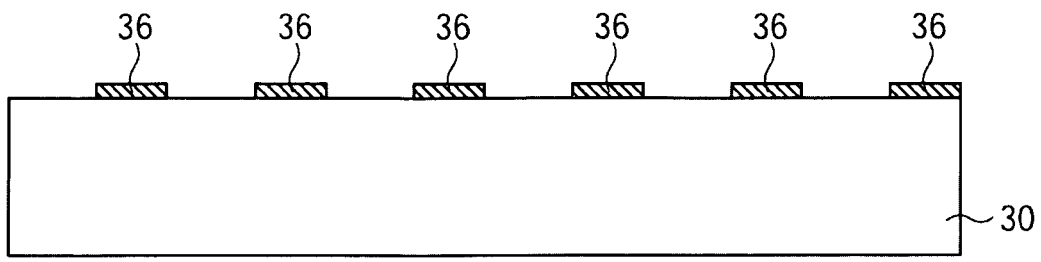

Then, the catalytic metal film 36 on the photoresist film 32 is removed by lift-off together with the photoresist film 32 to leave the catalytic metal film 36 selectively on the substrate 30 in the regions for the carbon nanotube bundles 12 to be formed on (FIG. 7A).

In the above, by the lift-off using photolithography, the catalytic metal film 36 is left selectively in the regions for the carbon nanotube bundles 12 to be formed on, but the process for selectively forming the catalytic metal film 36 is not limited to the above. For example, a metal mask having openings in the regions for the carbon nanotube bundles 12 to be formed in may be used. With the surface of the substrate 30 covered by the metal mask, the catalytic metal is sputtered to thereby form the catalytic metal film 36 selectively in the regions for the carbon nanotube bundles 12 to be formed on.

Then, over the substrate 30, carbon nanotubes are grown with the catalytic metal film 36 as the catalyst by, e.g., hot filament CVD method. The conditions for growing the carbon nanotubes are, e.g., the raw material gas: the mixed gas of acetylene and argon (partial pressure ratio 1:9), the total gas pressure in the film forming chamber: 1 kPa, the hot filament temperature: 1000° C., and the growing period of time: 20 minutes. Thus, multi-walled carbon nanotubes of 3-6 walls (average: about 4 walls), a 4-8 nm-diameter (average: about 6 nm) and an 80 μm-length (growth rate: 4 μm/min) can be grown. The carbon nanotubes may be grown another film forming process, such as thermal CVD method, remote plasma CVD method or others. The grown carbon nanotubes may be single-walled carbon nanotubes. As the carbon raw material, other than acetylene, hydrocarbons, such as methane, ethylene, etc., and alcohols, such as ethanol, methanol, etc., and others may be used.

Figure 7B:
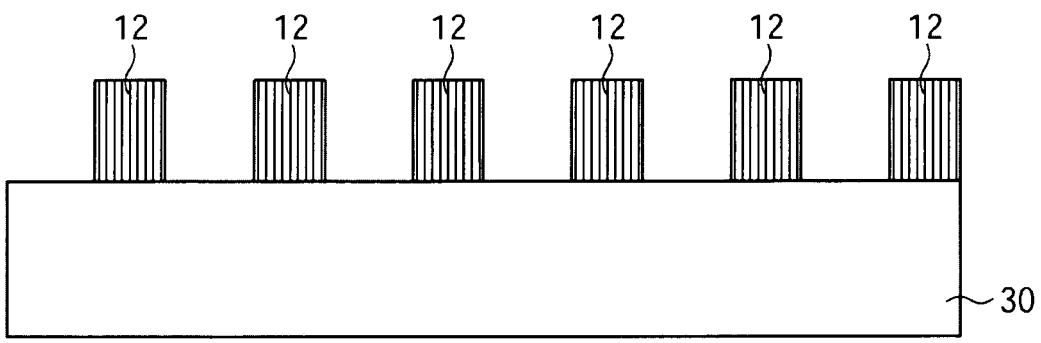

Thus, carbon nanotube bundles 12 containing a plurality of carbon nanotubes oriented in the normal direction of the substrate 30 (vertically) are selectively formed on the regions of the substrate 30, where the catalytic metal film 36 is formed (FIG. 7B). In the carbon nanotube bundles 12 formed under the above-described growing conditions, the carbon nanotube density inside the carbon nanotube bundles 12 is about $1 \times 10^{11}$ tubes/cm².

Next, a filling material to be the filling layer 14 is applied by, e.g., spin coating method. At this time, the viscosity of the coating solution and the rotation number of the spin coater are suitably set so that the filling material does not cover the tops of the carbon nanotube bundles 12.

For example, when acryl resin is used as the filling material, to make the height of the carbon nanotube bundles 12 and the thickness of the filling layer 14 substantially equal to each other (see FIG. 5A), it can be realized by, e.g., applying acrylic resin of a 440 mPa·s viscosity under the conditions of 2000 rpm and 20 seconds.

When the thickness of the filling layer 14 is made smaller than the height of the carbon nanotube bundles 12 (see FIG. 5C), it can be realized, e.g., by applying acryl resin of a 440 mPa·s viscosity under the conditions of 4000 rpm and 20 seconds. Otherwise, it can be realized by, e.g., applying acryl resin diluted to 80 wt % with an MEK (methyl ethyl ketone) solution under the conditions of 2000 rpm and 20 seconds.

The upper surfaces of the carbon nanotube bundles 12 may be exposed by ashing method or others after the filling material has been formed, covering the tops of the carbon nanotube bundles 12 (refer to a second embodiment).

The filling material is not especially limited as long as the filling material is liquid and then hardenable. Specifically, as the organic filling materials, acryl resin, epoxy resin, silicone resin, polyimide resin, etc. can be used. As the inorganic filling materials, insulating film forming compositions by using spin coating, such as SOG (Spin On Glass), etc., can be used. Metal materials, such as indium, solder, metal pastes (e.g., silver paste), etc., can be also used. Conductive polymers, such as polyaniline, polythiophene, etc., can be also used.

In forming the filling layer 14, because of a plurality of the carbon nanotube bundles 12 formed on the substrate 30 with gaps therebetween, the applied filling material first spread on the substrate 30 along the gaps. Then, the filling material goes on permeating into the carbon nanotube bundles 12.

If the carbon nanotubes are formed on the entire surface of the substrate 30, when the filling material permeates into the carbon nanotube, the discrete carbon nanotubes coagulate with each other, and the carbon nanotubes lose the orientation they have originally retained and tend to have configuration changes, e.g., to fall horizontally.

However, as in the present embodiment, providing a gap between the carbon nanotube bundles 12 allows the filling material to spread allover the surface of the substrate 30 and then permeate into the carbon nanotube bundles 12. Accordingly, the filling material filled in advance between the carbon nanotube bundles 12 acts as the supporter for retaining the configuration of the carbon nanotubes when the filling material permeates into the carbon nanotube bundles 12 and prevents the configuration changes of the carbon nanotube bundles 12. Thus, the filling layer 14 can be formed with the orientation of the carbon nanotube bundles 12 retained.

A gap required between the carbon nanotube bundles 12 varies, depending on a kind, viscosity, etc. of the filling material and cannot be unconditionally decided. The inventors of the present invention made studies and confirmed that a gap of not less than 0.1 μm can prevent the configuration change of the carbon nanotube bundles 12.

The resin layer 14 may be formed by immersing the substrate 30 in a solution of the filling material (the so-called dip method). In this case as well, the gap provided between the carbon nanotube bundles 12 can prevent the configuration change of the carbon nanotube bundles 12.

Figure 7C:
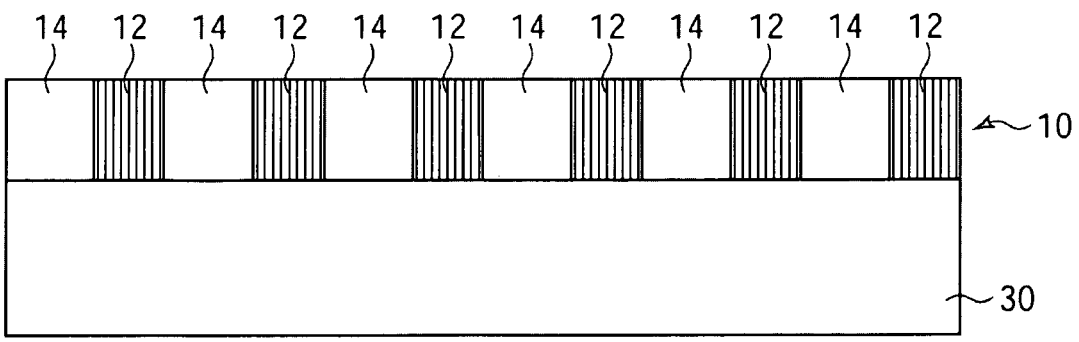

Next, the filling material is hardened to form the filling layer 14 of the filling material (FIG. 7C). For example, when a photo-curable material, such as acryl resin or others, is used as the filling material, the filler can be hardened by light irradiation. When a thermosetting material, such as epoxy resin, silicone resin or others, is used as the filling material, the filling material can be hardened by thermal processing. Epoxy resin can be thermoset, e.g., by 1 hour of heat processing of 150° C. Silicone resin can be thermoset, e.g., by 1 hour of heat processing of 200° C.

After the filling layer 14 has been hardened, when the upper ends of the carbon nanotube bundles 12 are not sufficiently exposed or are covered by the filling layer 14, the filling layer 14 on the carbon nanotube bundles 12 may be removed by CMP (Chemical Mechanical Polishing) or oxygen plasma ashing.

Figure 7D:
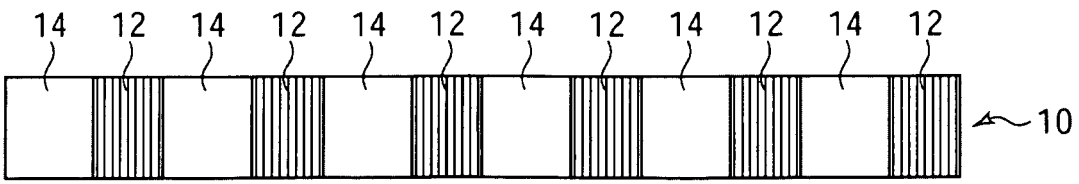

Next, the carbon nanotube bundles 12 and the filling layer 14 are peeled from the substrate 20, and the carbon nanotube sheet 10 is obtained (FIG. 7D).

At this time, with the surface of the substrate 30 being formed of a material which is able to easily peel the carbon nanotube sheet 10, when the silicon oxide film or silicon nitride film, for example, is formed on the surface of the substrate 30, and the filling layer 14 is formed of acryl resin, the carbon nanotube sheet 10 can be easily peeled from the substrate 30.

Otherwise, with a layer which cannot easily peel the carbon nanotube sheet 10 but can be etched selectively with respect to the carbon nanotube sheet 10, when silicon oxide film or silicon nitride film is formed on the surface of the substrate 10, and the filling layer 14 is formed of acryl resin, for example, the carbon nanotube sheet 10 can be easily peeled form the substrate 30. The carbon nanotube sheet 10 can be peeled from the substrate 30 by removing the silicon oxide film or the silicon nitride film by wet etching using, e.g., diluted hydrofluoric acid, boiled phosphoric acid or others.

With the surface of the substrate 30 being formed of a material which can neither easily peel the carbon nanotube sheet 10 nor is selectively removed, when the substrate 30 is a sapphire substrate, and the filling layer 14 is formed of silicone-based resin, for example, a sharp cutting tool is inserted into between the substrate 30 and the carbon nanotube sheet 10 to thereby peel the carbon nanotube sheet 10 from the substrate 30.

Before peeled, the carbon nanotube bundles 12 have been in direct contact with the substrate, so that the carbon nanotube bundles 12 are exposed on the peeled surface thereof on the side of the substrate 30. Accordingly, the carbon nanotube sheet 10 manufactured by the above-described manufacturing method can have both ends of the carbon nanotube bundles 12 exposed on both surfaces of the sheet.

When the filling material is acryl resin, in the process of the acryl resin being hardened, regions where the carbon nanotube bundles 12 are formed are relatively recessed due to the volume contraction ratio difference between the filling material and the carbon nanotubes. That is, the ends of the carbon nanotube bundles 12 on the surface of the carbon nanotube sheet 10 which has been in contact with the substrate 30 are recessed from the surface of the filling layer 14 (see FIG. 5B). These recesses can be utilized to mitigate stresses due to thermal expansion and can play the role of supporting the adhesion.

Then, as required, a coating film 18 is formed on one surface or both surfaces of the carbon nanotube sheet 10 (see FIG. 5D). The coating film 18 can be formed by, e.g., sputtering method. The coating film 18 of the layer film of, e.g., a 10 nm-thickness titanium (Ti) film and, e.g., a 50 nm-thickness gold (Au) film can be used.

As described above, according to the present embodiment, a plurality of the carbon nanotube bundles are formed on the substrate, spaced from each other, and then the filling material is filled to form the filling layer which supports the carbon nanotube bundles, whereby the configuration change of the carbon nanotube bundles in forming the filling layer can be prevented. Thus, the carbon nanotube sheet including the carbon nanotube bundles oriented in the direction of thickness of the sheet can be easily formed. The carbon nanotube bundles can have both ends exposed in the filling layer, which can improve the thermal conductivity and the electric conductivity with respect to an object for the carbon nanotube sheet to be mounted on.

A Second Embodiment

The carbon nanotube sheet and the method of manufacturing the same according to a second embodiment will be explained with reference to FIGS. 8A to 11B. The same members of the present embodiment as the carbon nanotube sheet and the method of manufacturing the same according to the first embodiment illustrated in FIGS. 1A to 7D are represented by the same reference numbers not to repeat or to simplify their explanation.

Figure 8A:
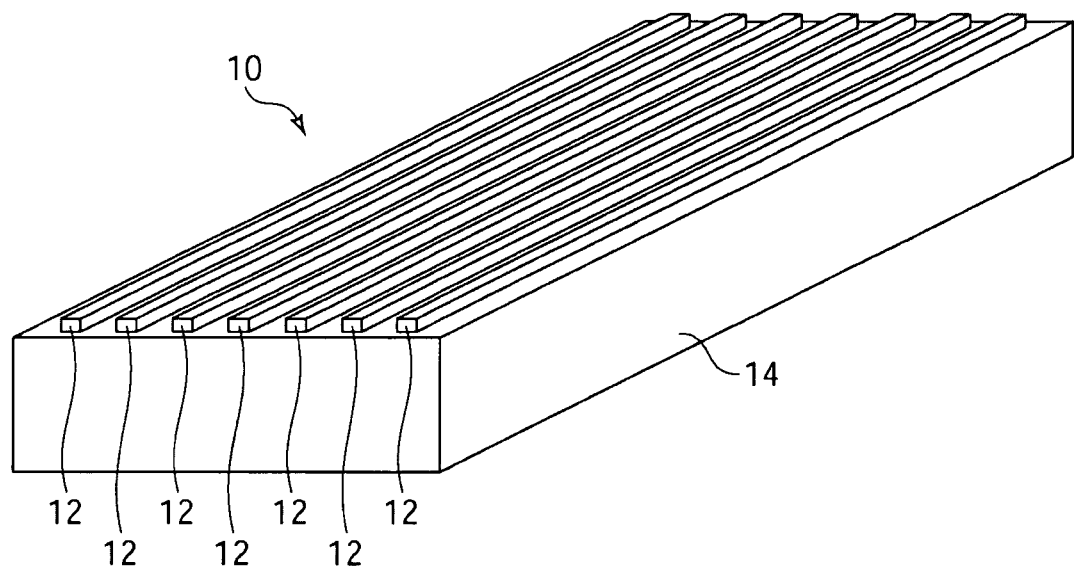
FIG. 8A is a perspective view illustrating a structure of the carbon nanotube sheet according to a second embodiment of the present invention.
Figure 8B:
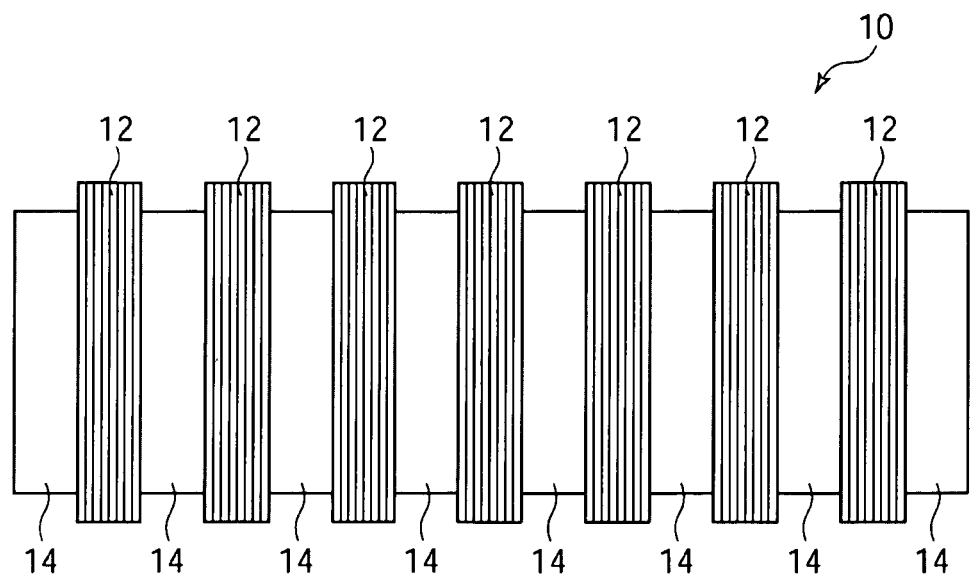
FIG. 8B is a diagrammatic sectional view illustrating the structure of the carbon nanotube sheet according to the second embodiment of the present invention.

FIG. 8A is a perspective view illustrating a structure of the carbon nanotube sheet according to the present embodiment. FIG. 8B is a diagrammatic sectional view illustrating the structure of the carbon nanotube sheet according to the present embodiment. FIGS. 9A-11B are sectional views illustrating a method of manufacturing the carbon nanotube sheet according to the present embodiment.

First, the structure of the carbon nanotube sheet according to the present embodiment will be explained with reference to FIGS. 8A and 8B.

As illustrated in FIG. 8A, the carbon nanotube sheet 10 according to the present embodiment comprises carbon nanotube bundles 12 of a stripe-shaped pattern buried by a filling layer 14. As illustrated in FIG. 8B, the ends of the carbon nanotube bundles 12 are positioned higher than the surface of the filling layer 14 on both surfaces of the sheet.

Such structure of the carbon nanotube sheet 10 permits the carbon nanotube bundles 12 to be easily and surely connected a heat radiator or a heat generator when the carbon nanotube sheet 10 is brought into contact with the heat radiator or the heat generator, whereby the thermal conductive efficiency can be largely improved. When the carbon nanotube sheet 10 is used as a conductive sheet, the carbon nanotube sheet 10 can be easily and surely connected to other interconnection structures, whereby the contact resistance can be largely reduced.

In the surface of another structure for the carbon nanotube sheet 10 according to the present embodiment to be contacted, surface concaves and convexes which are to engage with the surface convexes and concaves of the carbon nanotube sheet 10 are formed, whereby the concaves and convexes of both are engaged with each other, and the connection with high close contact can be obtained. The stripe-shaped convex and concave pattern of the carbon nanotube sheet 10 according to the present embodiment will be a pattern suitable for such use.

The projection amount of the carbon nanotube bundles 12 with respect to the filling layer 14 is sufficiently not more than about 1 μm (e.g., about 500 nm) from the viewpoint of ensuring the connection to another structure. The manufacturing method according to the present embodiment, which will be described later, can easily control the projection amount of the carbon nanotube bundles 12.

In the example illustrated in FIGS. 8A and 8B, the carbon nanotube bundles 12 have the ends projected with respect to the filling layer 14 on both sides of the sheet but may have the ends projected on only one side of the sheet. The plane pattern of the carbon nanotube bundles 12, the constituent material of the filling layer 14, the conditions for forming the carbon nanotube bundles 12 and the filling layer 14, the film thickness and other property value, etc. which are applicable to the carbon nanotube sheet 10 according to the present embodiment are the same as in carbon nanotube sheet according to the first embodiment.

Next, the method of manufacturing the carbon nanotube sheet according to the present embodiment will be explained with reference to FIGS. 9A to 11B. The detailed conditions for manufacturing the carbon nanotube sheet according to the present embodiment are the same as in the first embodiment.

First, a substrate 30 to be used as the base for manufacturing the carbon nanotube sheet 10 is prepared. As the substrate 30, a silicon substrate with, e.g., an about 1 μm-thickness silicon oxide film formed on is used.

Next, over the substrate 30, by photolithography, a photoresist film 30 having openings 34 for exposing the regions for the carbon nanotube bundles 12 to be formed in is formed.

Figure 9A:
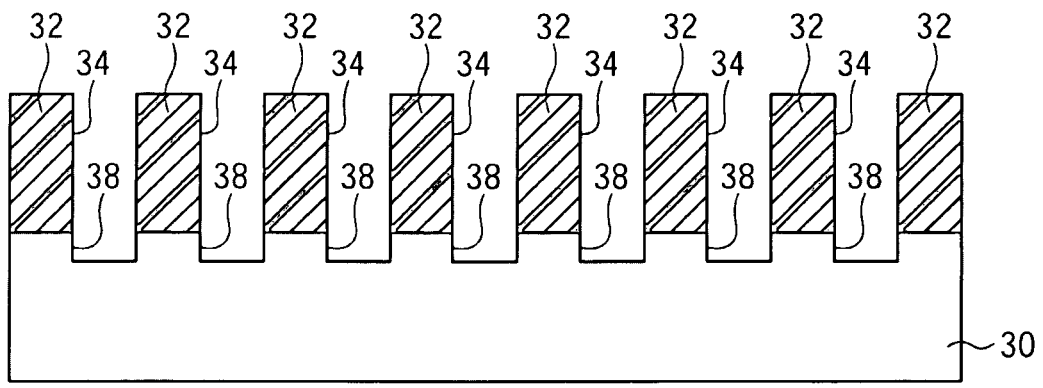
FIGS. 9A-9C, 10A-10B and 11A-11B are sectional views illustrating a method of manufacturing the carbon nanotube sheet according to the second embodiment of the present invention.

Next, with the photoresist film 32 as the mask, the substrate 30 is anisotropically etched to form concaves 38 of an about 500 nm-depth in the surface of the substrate 30 (FIG. 9A). The concaves 38 are formed in the regions of the substrate 30, where the carbon nanotube bundles 12 are to be formed. The width of the concaves 38 can be, set at, e.g., 100 μm, and the gap between the concaves 38 can be set at, e.g., 20 μm. Preferably, the width and the gap of the concaves 38 are set suitably in accordance with a thermal conductivity, etc. necessary for the carbon nanotube sheet 10.

The depth of the concaves 38 corresponds to the projection amount of the carbon nanotube sheet 12 with respect to the filling layer 14. Accordingly, the depth of the concaves 38 is suitably set, whereby the projection amount of the carbon nanotube bundles 12 with respect to the filling layer 14 can be controlled.

Figure 9B:
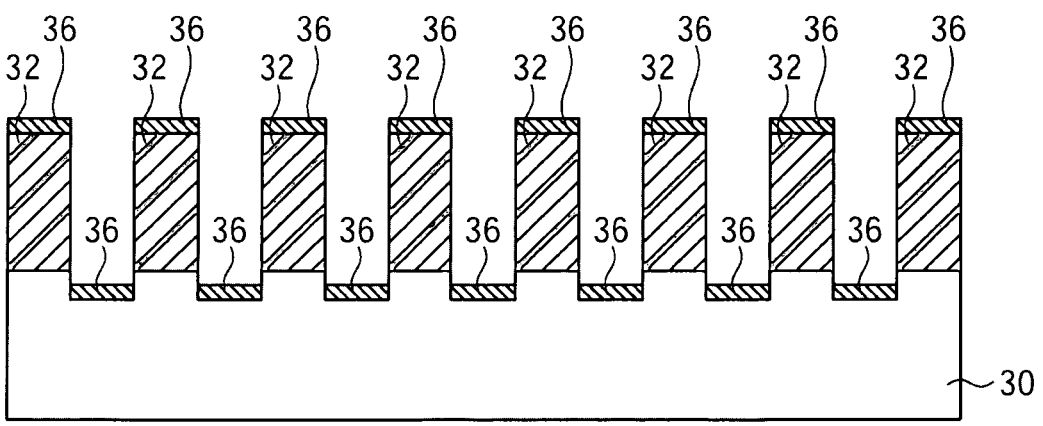

Then, by, e.g., sputtering method, a 2.5 nm-thickness Fe (iron) film, for example, is formed to form a catalytic metal film 36 of Fe (FIG. 9B). The catalytic metal film 36 is formed on the photoresist film 32 and in the concaves 38 of the substrate 30.

Figure 9C:
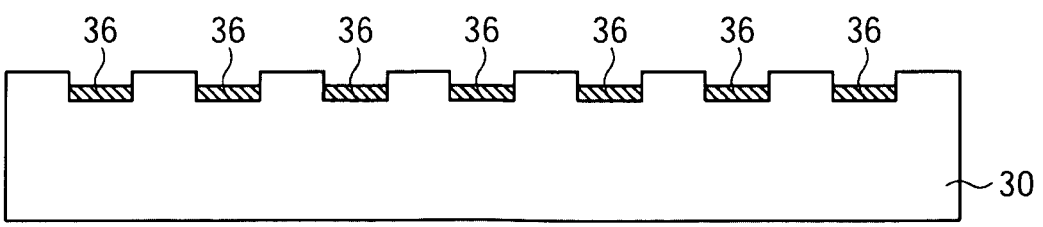

Then, the catalytic metal film 36 on the photoresist film 32 is lifted off together with the photoresist film 32 to leave the catalytic metal film 36 selectively in the concaves 38 of the substrate 30 (FIG. 9C).

Figure 10A:
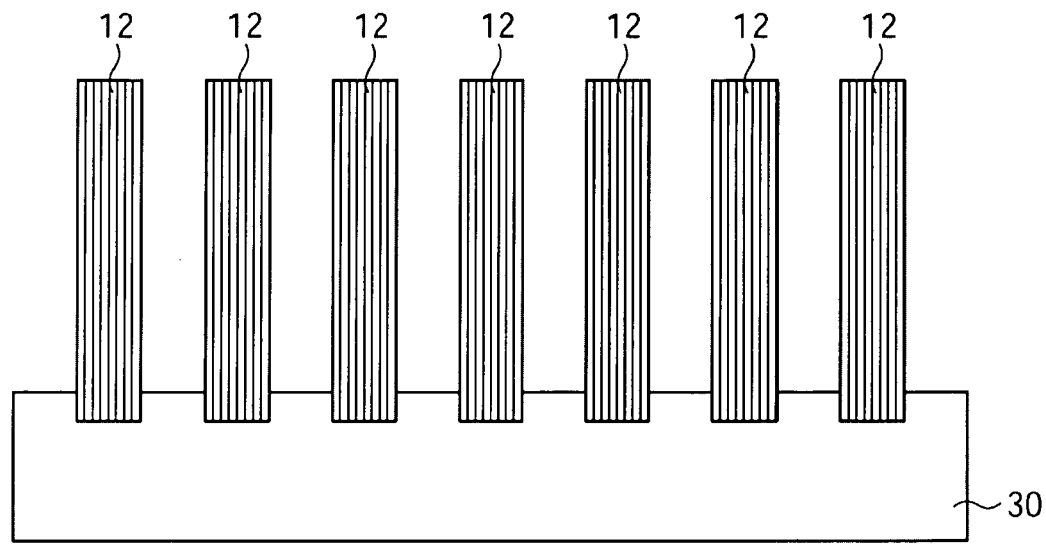

Next, over the substrate 30, with the catalytic metal film 35 as the catalyst, carbon nanotubes are grown by, e.g., hot filament CVD method. Thus, the carbon nanotube bundles 12 containing a plurality of carbon nanotubes oriented in the direction of the normal of the substrate 30 are selectively grown in the region of the concaves 38 (FIG. 10A).

Figure 10B:
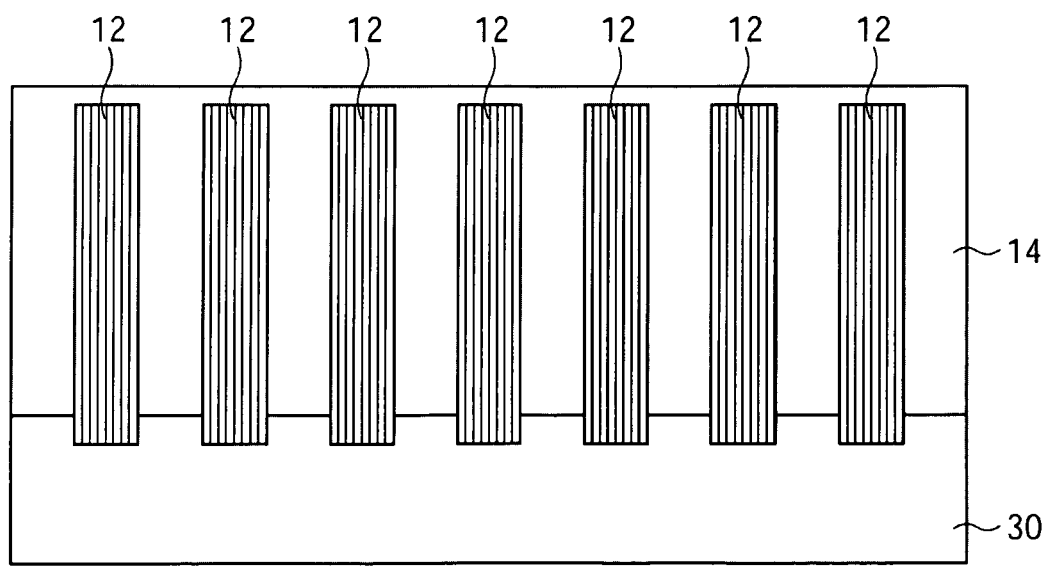

Then, epoxy resin, for example, is applied by, e.g., spin coating method, and then thermal processing of, e.g., 150° C. is made for 1 hour to cure the epoxy resin. Thus, the filling layer of epoxy resin is formed (FIG. 10B).

Figure 11A:
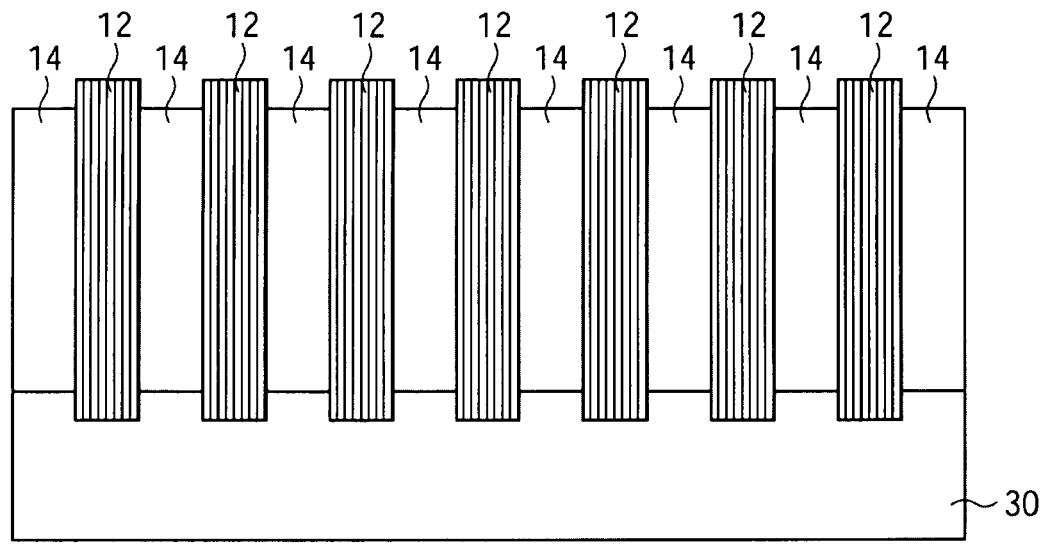

Next, an upper part of the filling layer 14 is removed by, e.g., ashing using oxygen plasma to expose upper ends of the carbon nanotube bundles 12 (FIG. 11A). The conditions for the ashing can be, e.g., the power: 200 W and the period of time: 10 minutes. The upper part of the filling layer 14 may be removed by heating in an oxygen atmosphere in place of the ashing with oxygen plasma.

When epoxy is used as the filling layer 14, the ashing selective ratio of the filling layer 14 to the carbon nanotube bundles 12 is about 1.26. Accordingly, the upper part of the filling layer 14 is ashed, whereby the upper ends of the carbon nanotube bundles 12 can be higher than the surface of the filling layer 14. The etching rate of the filling layer 14 is suitably set, whereby the projection amount of the carbon nanotube bundles 12 with respect to the filling layer 14 can be controlled.

Before the ashing using oxygen plasma, the upper ends of the carbon nanotube bundles 12 may be exposed by, e.g., chemical mechanical polishing.

In the present embodiment, the filling layer 14 is formed, covering the upper ends of the carbon nanotube bundles 12, but as in the first embodiment, the upper ends of the carbon nanotube bundles 12 may be exposed by controlling the application conditions of the filling layer 14. In this case, the step of FIG. 11A is not required. It is sufficient that the upper ends of the carbon nanotube bundles 12 are exposed in the step of FIG. 11A, When the upper ends of the carbon nanotube bundles 12 of only one surface of the sheet is projected.

Figure 11B:
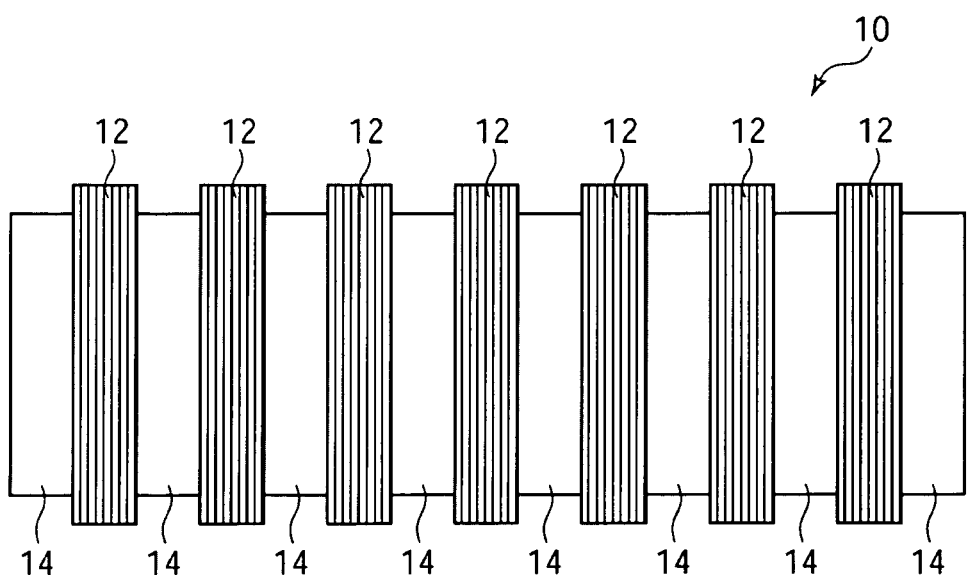

Then, the carbon nanotube bundles 12 and the resin layer 14 are peeled from the substrate 30, and the carbon nanotube sheet 10 having the carbon nanotube bundles 12 projected with respect to the surface of the filling layer 12 on both surfaces of the sheet is formed (FIG. 11B).

As described above, according to the present embodiment, the carbon nanotube sheet having the ends of the carbon nanotube bundles projected with respect to the surface of the filling layer can be easily manufactured. Such carbon nanotube sheet can further improve the thermal conductivity and the electric conductivity with respect to an object to be mounted on.

A Third Embodiment

The carbon nanotube sheet and the method of manufacturing the same according to a third embodiment will be explained with reference to FIGS. 12A to 14C. The same members of the present embodiment as those of the carbon nanotube sheet and the method of manufacturing the same according to the first and the second embodiments illustrated in FIGS. 1A to 11B are represented by the same reference numbers not to repeat or to simplify their explanation.

Figure 12A:
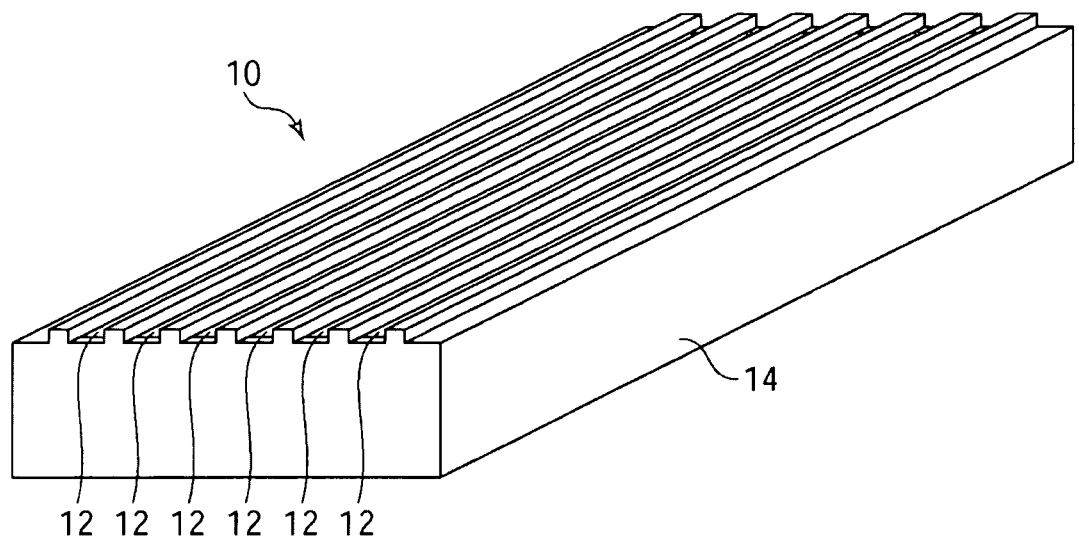
FIG. 12A is a perspective view illustrating a structure of the carbon nanotube sheet according to a third embodiment of the present invention.
Figure 12B:
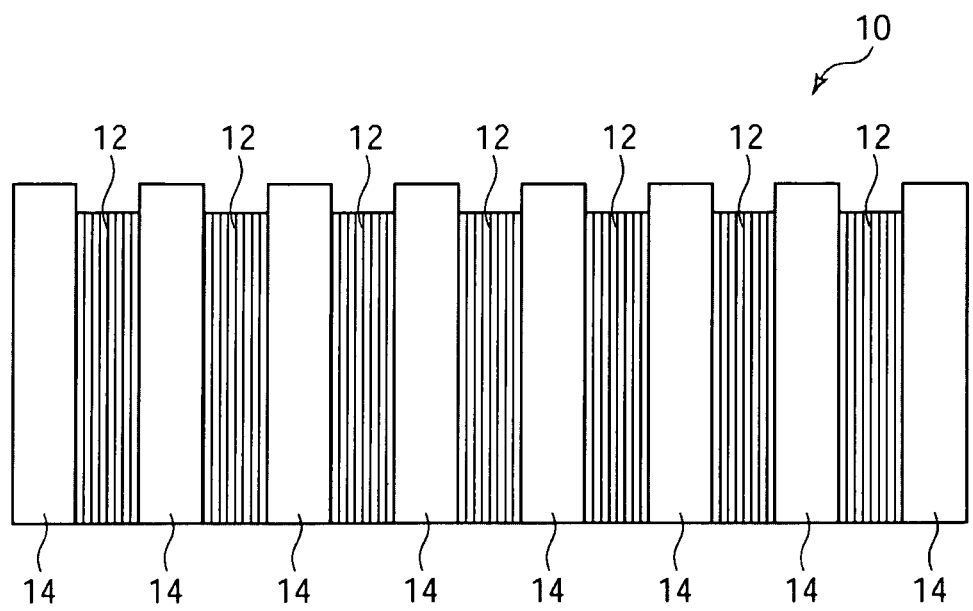
FIG. 12B is a diagrammatic sectional view illustrating the structure of the carbon nanotube sheet according to the third embodiment of the present invention.

FIG. 12A is a perspective view illustrating a structure of the carbon nanotube sheet according to the present embodiment. FIG. 12B is a diagrammatic sectional view illustrating the structure of the carbon nanotube sheet according to the present embodiment. FIGS. 13A-13C and 14A-14C are sectional views illustrating a method of manufacturing the carbon nanotube sheet according to the present embodiment.

First, the structure of the carbon nanotube sheet according to the present embodiment will be explained with reference to FIGS. 12A and 12B.

As illustrated in FIG. 12A, the carbon nanotube sheet 10 according to the present embodiment comprises carbon nanotube bundles 12 of a stripe-shaped pattern buried by a filling layer 14. As illustrated in FIG. 12B, the ends of the carbon nanotube sheet 12 are lower than the surface of the filling layer 14 on one surface of the sheet. The ends of the carbon nanotube bundles 12 are not covered by the filling layer 14.

Such structure of the carbon nanotube sheet 10 permits the carbon nanotube sheet 10 to be connected directly to a heat radiator or a heat generator when the carbon nanotube sheet 10 is brought into contact with the heat radiator or the heat generator, whereby the thermal conductive efficiency can be largely improved. When the carbon nanotube sheet 10 is used as a conductive sheet, the carbon nanotube sheet 10 can be connected directly to other interconnection structures, and the contact resistance can be largely decreased. As described in the first embodiment, the carbon nanotube sheet 10 is disposed between the heat radiator and the heat generator in close contact, stresses to be exerted to the carbon nanotube bundles 12 could be mitigated by the filling layer 14.

Surface concaves and convexes which are to be engaged with the surface concaves and convexes of the carbon nanotube sheet 10 are formed in the surface of another structure to be contacted with the carbon nanotube sheet 10 according to the present embodiment, whereby the concaves and the convexes are engaged with each other in close contact. The stripe-shaped concave and convex pattern of the carbon nanotube sheet 10 according to the present embodiment will be a suitable pattern for such use.

The plane pattern of the carbon nanotube bundles 12, the constituent material of the filling layer 14, the conditions for forming the carbon nanotube bundles 12 and the filling layer 14, the film thickness and other property values, etc. which are applicable to the carbon nanotube sheet 10 according to the present embodiment are the same as those of the carbon nanotube sheet according to the first embodiment.

Then, the method of manufacturing the carbon nanotube sheet according to the present embodiment will be explained with reference to FIGS. 13A and 14C. The detailed conditions for manufacturing the carbon nanotube sheet 10 according to the present embodiment are the same as those of the first embodiment.

First, a substrate 30 as the base for forming the carbon nanotube sheet 10 is prepared. As the substrate 30, a silicon substrate with an about 1 μm-thickness silicon oxide film formed on is used.

Figure 13A:
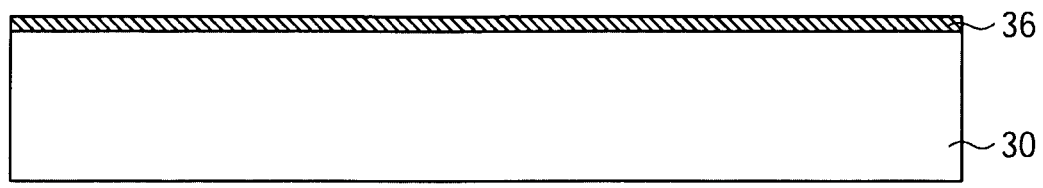
FIGS. 13A-13C and 14A-14C are sectional views illustrating a method of manufacturing the carbon nanotube sheet according to the third embodiment of the present invention.

Next, a 2.5 nm-thickness Fe (iron) film is formed over the substrate 30 by, e.g., sputtering method to form a catalytic metal film 36 of Fe (FIG. 13A).

Next, over the substrate 30, a photoresist film 32 covering the regions for the carbon nanotube bundles 12 to be formed in and exposing the rest region is formed by photolithography.

Figure 13B:
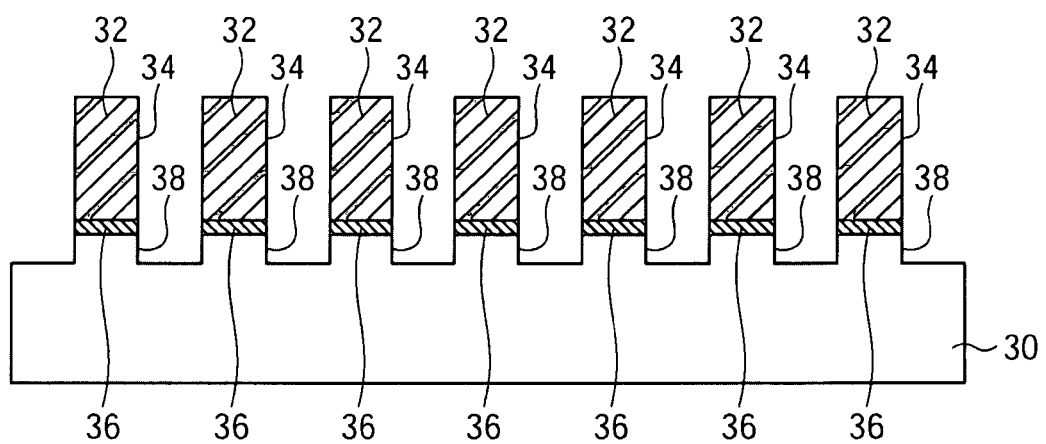

Then, with the photoresist film 32 as the mask, the catalytic metal film 36 and the substrate 30 are anisotropically etched to form the concaves 38 of an about 500 nm-depth in the surface of the substrate 30 (FIG. 13B). The concaves 38 are formed in the regions other than the regions for the carbon nanotube bundles 12 to be formed on. The width of the concaves 38 can be set at, e.g., 20 μm, and the gap of the concaves 38 can be set at, e.g., 100 μm. Preferably, the width and the gap of the concaves 38 are set suitably in accordance with a thermal conductivity, etc. required for the carbon nanotube sheet 10.

Figure 13C:
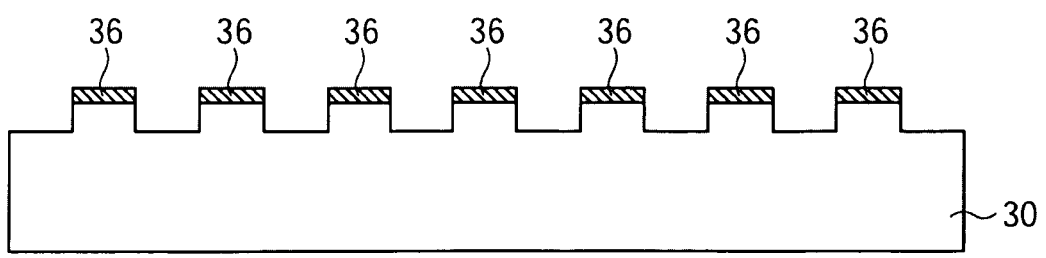

Next, by, e.g., ashing, the photoresist film 32 is removed (FIG. 13C).

Figure 14A:
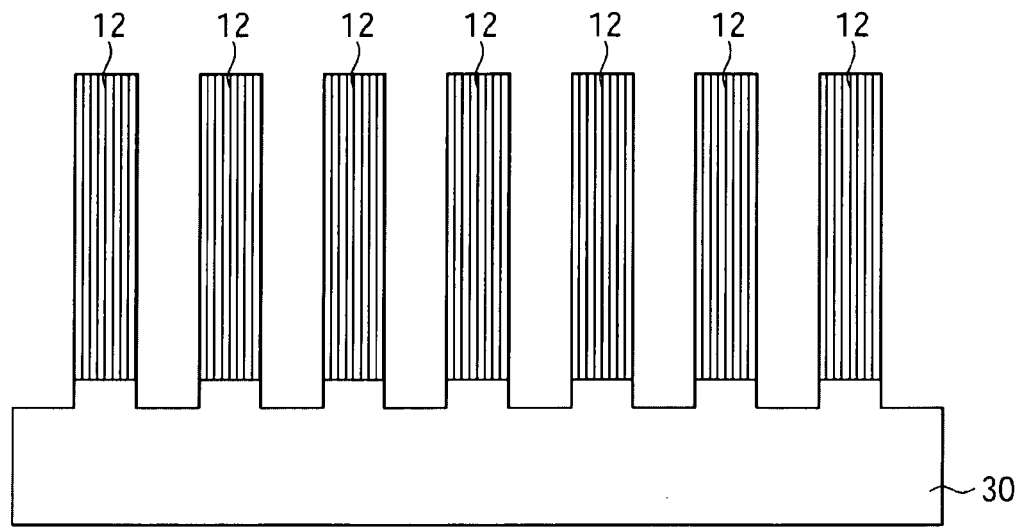

Then, with the catalytic metal film 36 as the catalyst, carbon nanotubes are grown by, e.g., hot filament CVD method. Thus, the carbon nanotube bundles 12 containing a plurality of the carbon nanotubes oriented in the direction of the normal of the substrate 30 are formed selectively on the regions of the substrate other than the regions for the concaves 38 to be formed in (FIG. 14A).

Then, by, e.g., spin coating, epoxy resin, for example, is applied, and then thermal processing, e.g., of 150° C. is made for 1 hour to harden the epoxy resin. Thus, the filling layer 14 of epoxy resin is formed. The filling layer 14 is formed also in the concaves 38 of the substrate 30 (FIG. 14B).

Figure 14B:
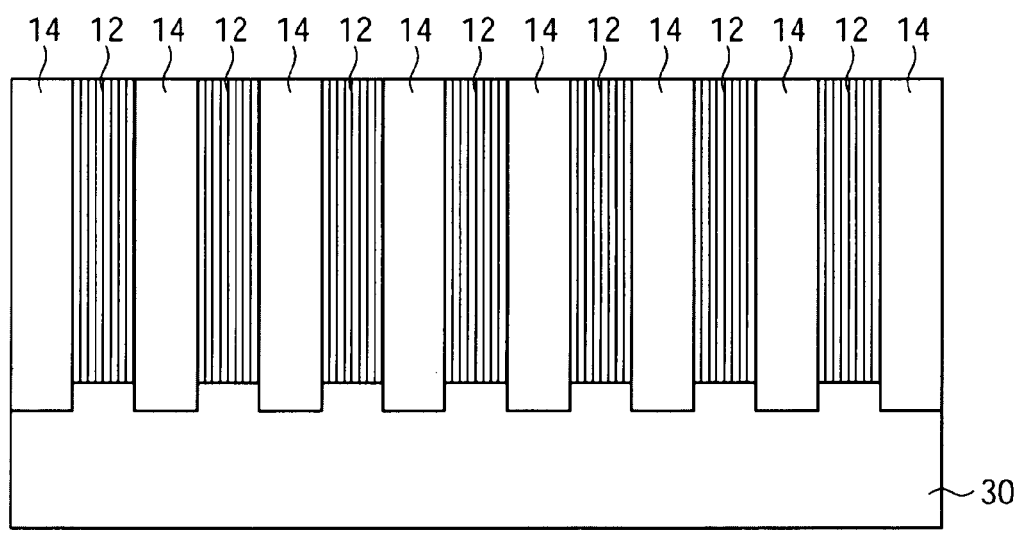

In FIG. 14B, the surfaces of the carbon nanotube bundles 12 and the surface of the filling layer 14 are flash with each other, but the ends of the carbon nanotube bundles 12 may be projected with respect to the surface of the filling layer 14. The process for forming such configuration is the same as in the first and the second embodiments.

Figure 14C:
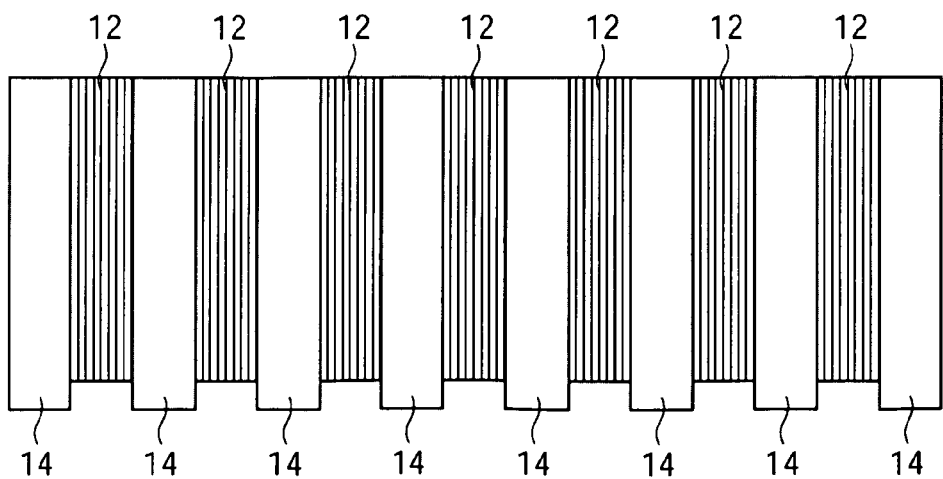

Next, the carbon nanotube bundles 12 and the resin layer 14 are peeled from the substrate 30, and the carbon nanotube sheet 10 having the ends of the carbon nanotube bundles 12 positioned on one surface of the sheet lower than the surface of the filling layer 14 is obtained (FIG. 14C).

As described above, according to the present embodiment, the carbon nanotube sheet comprising the carbon nanotube bundles having the ends recessed with respect to the surface of the filling layer can be easily formed. Thus, when the carbon nanotube sheet is press-contacted to an object for the carbon nanotube sheet to be mounted on, stresses exerted to the carbon nanotube bundles can be mitigated by the filling layer.

A Fourth Embodiment

The carbon nanotube sheet and the method of manufacturing the same according to a fourth embodiment will be explained with reference to FIGS. 15A to 19B. The same members of the present embodiment as those of the carbon nanotube sheet and the method of manufacturing the same according to the first to the third embodiments illustrated in FIGS. 1A to 14C are represented by the same reference numbers not to repeat or to simplify their explanation.

Figure 15A:
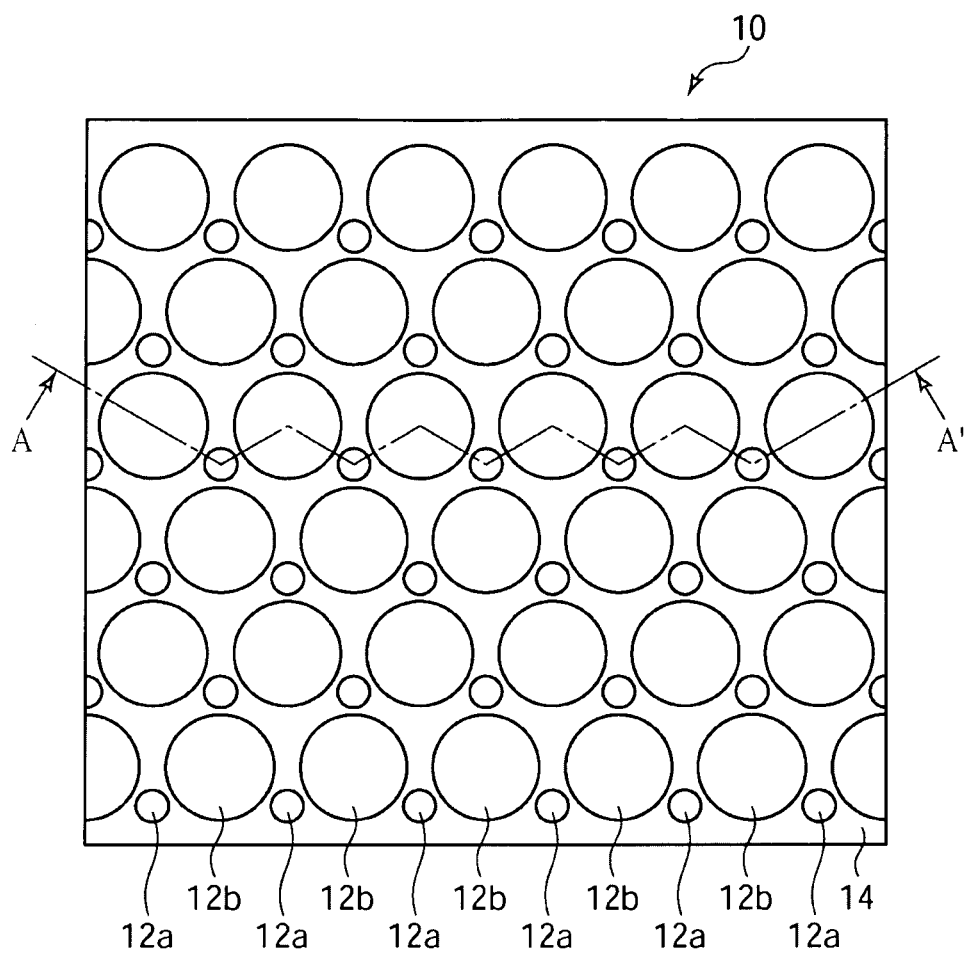
FIG. 15A is a plan view illustrating a structure of the carbon nanotube sheet according to a fourth embodiment of the present invention.
Figure 15B:
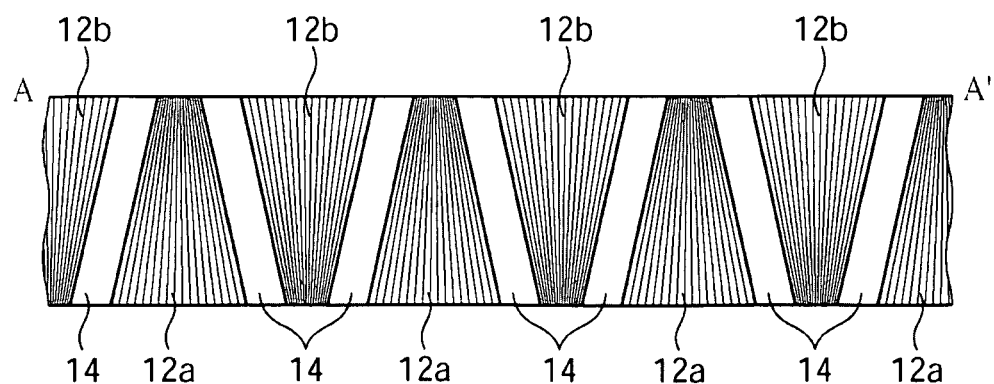
FIG. 15B is a diagrammatic sectional view illustrating the structure of the carbon nanotube sheet according to the fourth embodiment of the present invention.
Figure 16:
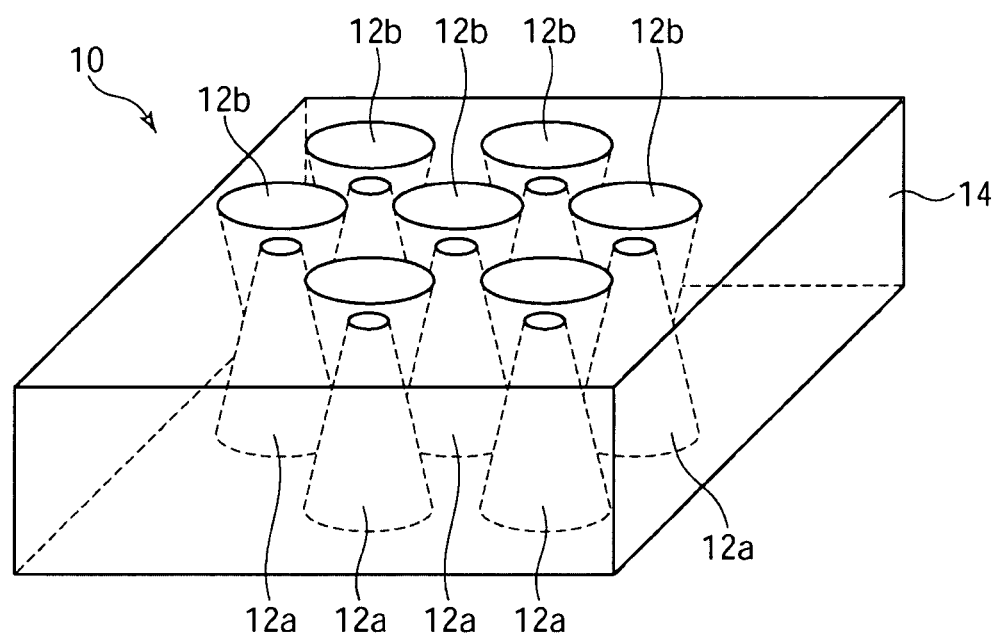
FIG. 16 is a perspective view illustrating the structure of the carbon nanotube sheet according to the fourth embodiment of the present invention.

FIG. 15A is a plan view illustrating a structure of the carbon nanotube sheet according to the present embodiment. FIG. 15B is a diagrammatic sectional view illustrating the structure of the carbon nanotube sheet according to the present embodiment. FIG. 16 is a perspective view illustrating the structure of the carbon nanotube sheet according to the present embodiment. FIGS. 17A-17C, 18A-18B and 19A-19B are views illustrating a method of manufacturing the carbon nanotube sheet according to the present embodiment.

First, the structure of the carbon nanotube sheet according to the present embodiment will be explained with reference to FIGS. 15A to 16.

As illustrated in FIGS. 15A to 16, the carbon nanotube sheet 10 according to the present embodiment is the same as the carbon nanotube sheet according to the first to the third embodiments in that a plurality of carbon nanotube bundles 12a, 12b are arranged spaced from each other with a gap, and a filling layer 14 of a resin material or others is filled in the gaps.

In the carbon nanotube sheet 10 according to the present embodiment, each of the plural carbon nanotube bundles 12 has a tapered configuration having the diameter of one end smaller than the diameter of the other end. Each of the carbon nanotube bundles 12a, 12b has the tapered configurations defined by the gaps between the carbon nanotubes gradually decreased from the end of the larger diameter toward the end of the smaller diameter. In other words, the number of the carbon nanotubes does not substantially change between the side of the larger diameter of the carbon nanotube bundles 12a, 12b and the side of the smaller diameter of the carbon nanotube bundles 12a, 12b.

The plurality of carbon nanotube bundles 12 are divided in the carbon nanotube bundles 12a having a smaller diameter on one surface of the carbon nanotube sheet 10, and the carbon nanotube bundles 12b having a smaller diameter on the other surface of the carbon nanotube sheet 10. As exemplified in FIGS. 15B and 16, the carbon nanotube bundles 12a and the carbon nanotube bundles 12b are arranged alternately so as to engage with each other and fill the gaps.

As the carbon nanotube sheet 10 is viewed from one surface of the carbon nanotube sheet 10, as exemplified in FIG. 15A and FIG. 15B, the smaller-diameter ends of the carbon nanotube bundles 12a and the large-diameter ends of the carbon nanotube bundles 12b are exposed. As illustrated in FIG. 15B, on the other surface of carbon nanotube sheet 10, the large-diameter ends of the carbon nanotube bundles 12a and the smaller-diameter ends of the carbon nanotube bundles 12b are exposed.

Such carbon nanotube bundles 12a, 12b are used to thereby increase the number of the carbon nanotubes per a unit area of the carbon nanotube sheet 10 (the surface density of the carbon nanotubes).

For example, when it is assumed that the diameters of the large-diameter ends of the carbon nanotube bundles 12b and the arrangement gap thereof are the same as those of the carbon nanotube bundles 12 of the carbon nanotube sheet according to the first embodiment illustrated in FIG. 1A, as illustrated in FIG. 15A, in the gaps between the carbon nanotube bundles 12b, the same number of the carbon nanotube bundles 12a can be further arranged. That is, the surface density of the carbon nanotubes of the carbon nanotube sheet 10 can be doubled. Thus, the thermal conductivity and electric conductivity of the carbon nanotube sheet 10 can be drastically increased.

Next, the method of manufacturing the carbon nanotube sheet according to the present embodiment will be explained with reference to FIGS. 17A to 19B.

Figure 17A:
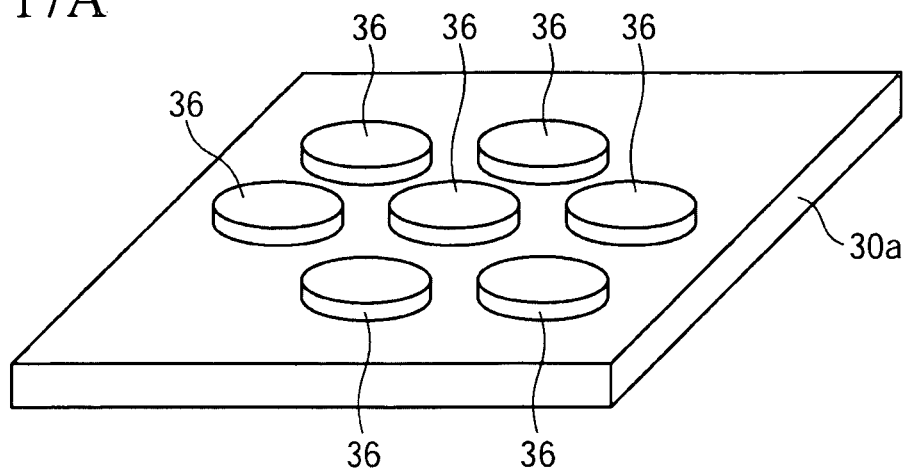
FIGS. 17A-17C, 18A-18B and 19A-19B are views illustrating a method of manufacturing the carbon nanotube sheet according to the fourth embodiment of the present invention.

First, in the same way as in the method of manufacturing the carbon nanotube sheet according to, e.g., the first embodiment, a catalytic metal film 36 is formed on a substrate 30a in the regions for the carbon nanotube bundles 12 to be formed in (FIG. 17A). The substrate 30a is the same as the substrate 30 of the first to the third embodiments.

Next, over the substrate 30a, carbon nanotubes are grown with the catalytic metal film 36 as the catalyst by, e.g., hot filament CVD method. Thus, the carbon nanotube bundles 12 of a plurality of carbon nanotubes oriented in the normal direction of the substrate 30a are formed selectively over the substrate 30a in the regions where the catalytic metal film 36 has been formed (FIG. 17B).

Then, the substrate 30a with the carbon nanotube bundles 12 formed on is immersed in a liquid and dried. When the carbon nanotube bundles 12 are immersed in the liquid, the gaps between the carbon nanotubes are filled with the liquid. In this state, as the liquid goes on evaporating, with the decrease of the volume of the liquid between the carbon nanotubes, attractive forces work due to the surface tension between the adjacent carbon nanotubes. The ends of the carbon nanotube bundles 12, which are on the side of the substrate 30a are retained by the substrate 30a, and the gaps between the carbon nanotubes are not changed. However, with the forward ends of the carbon nanotubes being not secured, the gaps between the carbon nanotubes goes on gradually decreasing. When the gaps between the carbon nanotubes have sufficiently small, the carbon nanotubes are secured with the van der Waals force. Thus, the carbon nanotube bundle 12 after the liquid has been dried become the tapered nanotube bundles 12a having the diameter of the forward ends smaller than the diameter of the ends on the side of the substrate 30a (FIG. 17C).

The liquid to be used in tapering the carbon nanotube bundles 12 is not especially limited as long as the liquid has good wetting to the carbon nanotubes and is evaporable at a temperature which is not so high as to break the carbon nanotubes. For example, an organic chemical liquid, such as alcohol-based chemical liquid, ketone-based chemical liquid or others can be used. The alcohol-based chemical liquid is not especially limited and can be, e.g., isopropyl alcohol, ethanol, methanol, etc. The ketone-based chemical liquid is not especially limited and can be, e.g., acetone, methyl ethyl ketone, methyl isobutyl ketone, etc.

Figure 17B:
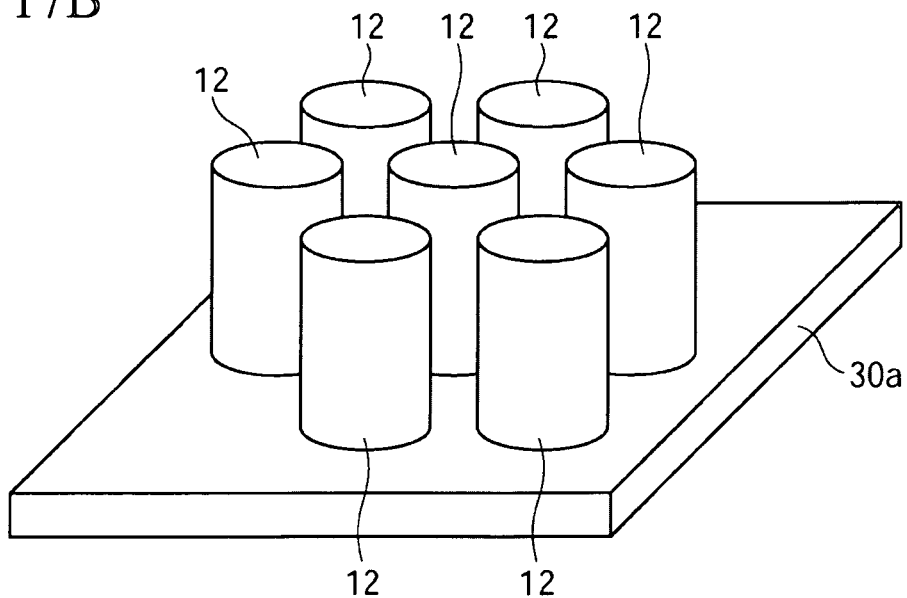
Figure 17C:
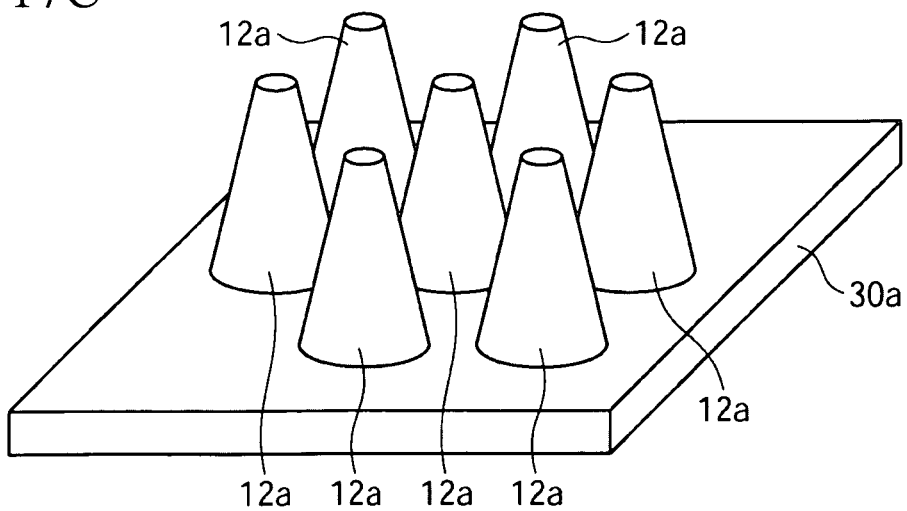

Then, in the same way as illustrated in FIGS. 17A to 17C, the tapered carbon nanotube bundles 12b are formed on a substrate 30b.

Figure 18A:
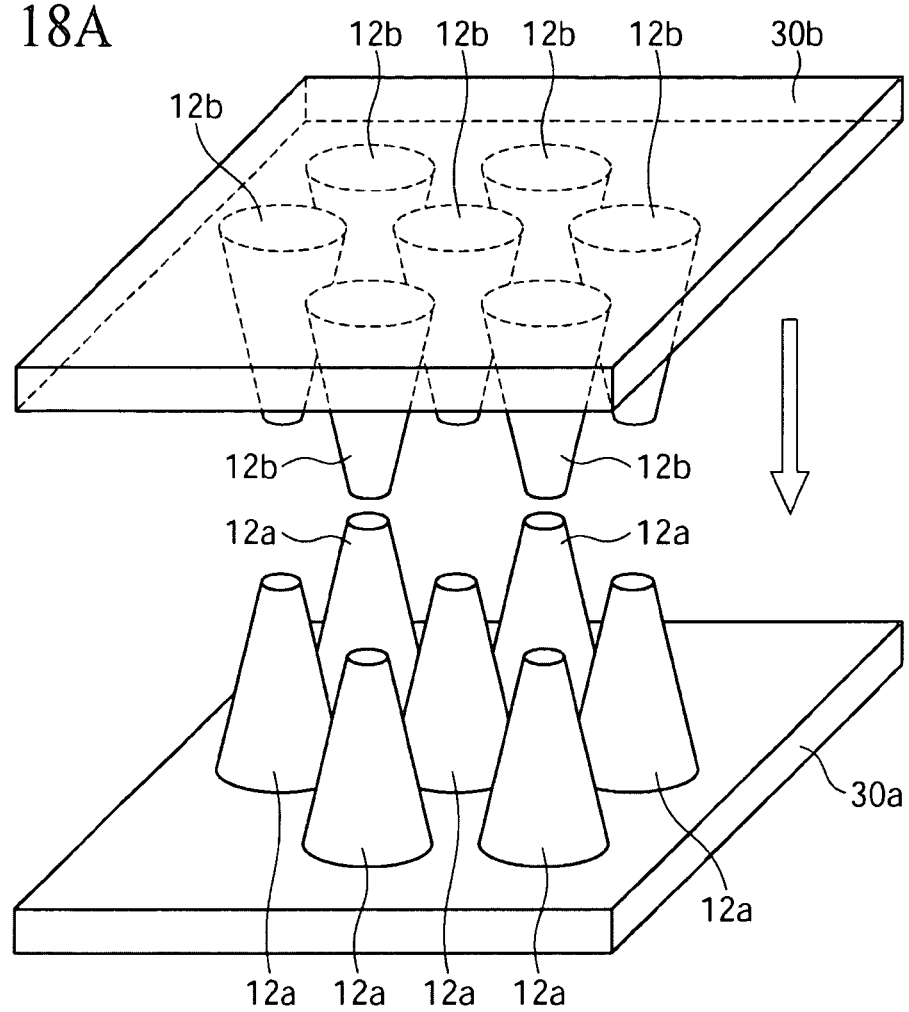
Figure 18B:
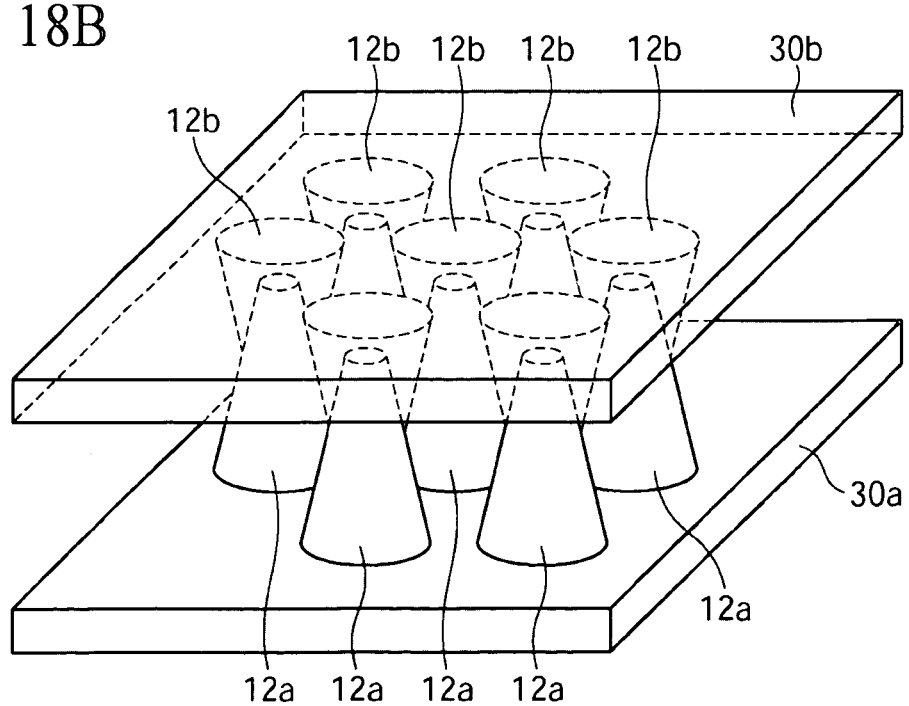

Next, the substrate 30a and the substrate 30b are bonded with each other with the surface of the substrate 30a, where the carbon nanotube bundles 12a are formed, and the surface of the substrate 30b, where the carbon nanotube bundles 12b are formed opposed to each other (FIGS. 18A and 18B).

At this time, the carbon nanotube bundles 12a, 12b are laid out alternately so as to engage with each other and fill the gaps, whereby the carbon nanotube bundles 12a fill the gaps between the carbon nanotube bundles 12b, and the carbon nanotube bundles 12b fill the gaps between the carbon nanotube bundles 12a. The forward ends of the carbon nanotube bundles 12a contacts the surface of the substrate 30b, and the forward ends of the carbon nanotube bundles 12b contact the surface of the substrate 30a.

The layout regions of the carbon nanotube bundles 12a, 12b are not limited to those of the present embodiment as long as the layout regions can mutually fill their gaps and can be suitably changed. The shape and the area of the regions for the carbon nanotube bundles 12a to be formed in and the shape and the area of the regions for the carbon nanotube bundles 12b to be formed in may be different from each other, and the layout of the carbon nanotube bundles 12a and that of the carbon nanotube bundles 12b may be different from each other.

Figure 19A:
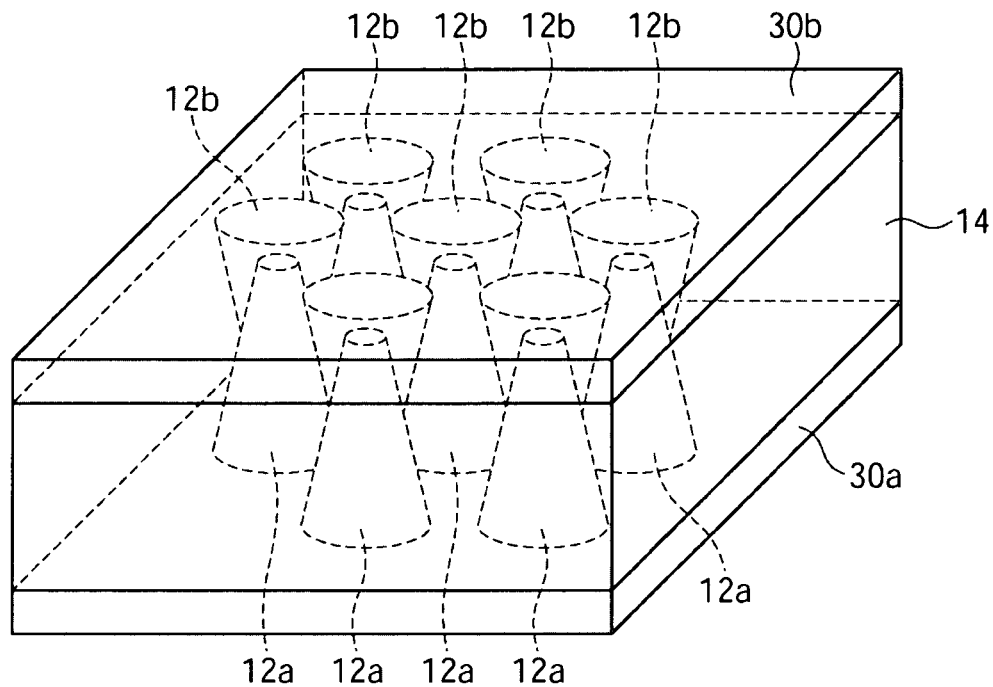

Then, a filling material to be the filling layer 14 is filled between the substrate 30a and the substrate 30b, and the filling layer 14 is filled between the carbon nanotube bundles 12a, 12b (FIG. 19A). At this time, the ends of the carbon nanotube bundles 12a, 12b, which are in direct contact with the substrates 30a, 30b, are not covered by the filling layer 14. The effect of preventing the cohesion of the carbon nanotubes is the same as in the first embodiment.

Figure 19B:
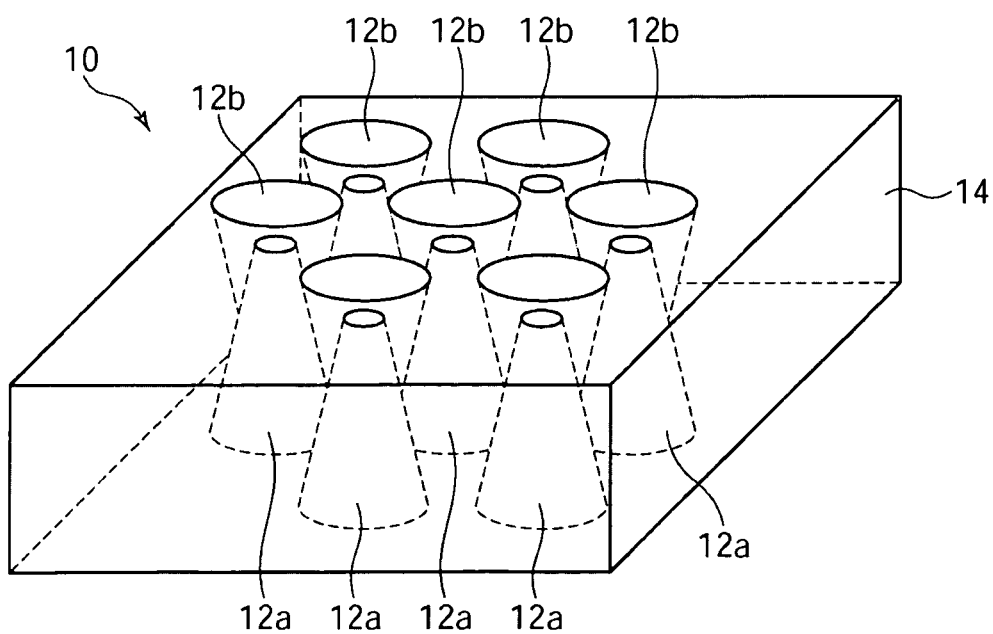

Then, in the same way as in the method of manufacturing the carbon nanotube sheet according to the first embodiment, the carbon nanotube bundles 12a, 12b, and the filling layer 14 are peeled from the substrates 30a. 30b, and the carbon nanotube sheet 10 is obtained (FIG. 19B).

Next, as required, the filling layer 14 is subjected to etching-back, etc. to project the ends of the carbon nanotube bundles 12a, 12b from the surface of the filling layer 14.

As described above, according to the present embodiment, the carbon nanotube sheet including the carbon nanotube bundles having a smaller diameter on one surface and the carbon nanotube bundles having a smaller diameter on the other surface is formed, whereby the surface density of the carbon nanotubes can be drastically increased. Thus, the thermal conductivity and/or the electrical conductivity of the carbon nanotube sheet can be drastically improved.

A Fifth Embodiment

The carbon nanotube sheet and the method of manufacturing the same according to a fifth embodiment will be explained with reference to FIGS. 20 to 22B. The same members of the present embodiment as those of the carbon nanotube sheet and the method of manufacturing the same according to the first to the fourth embodiments illustrated in FIGS. 1A to 19B are represented by the same reference numbers not to repeat or to simplify their explanation.

Figure 20:
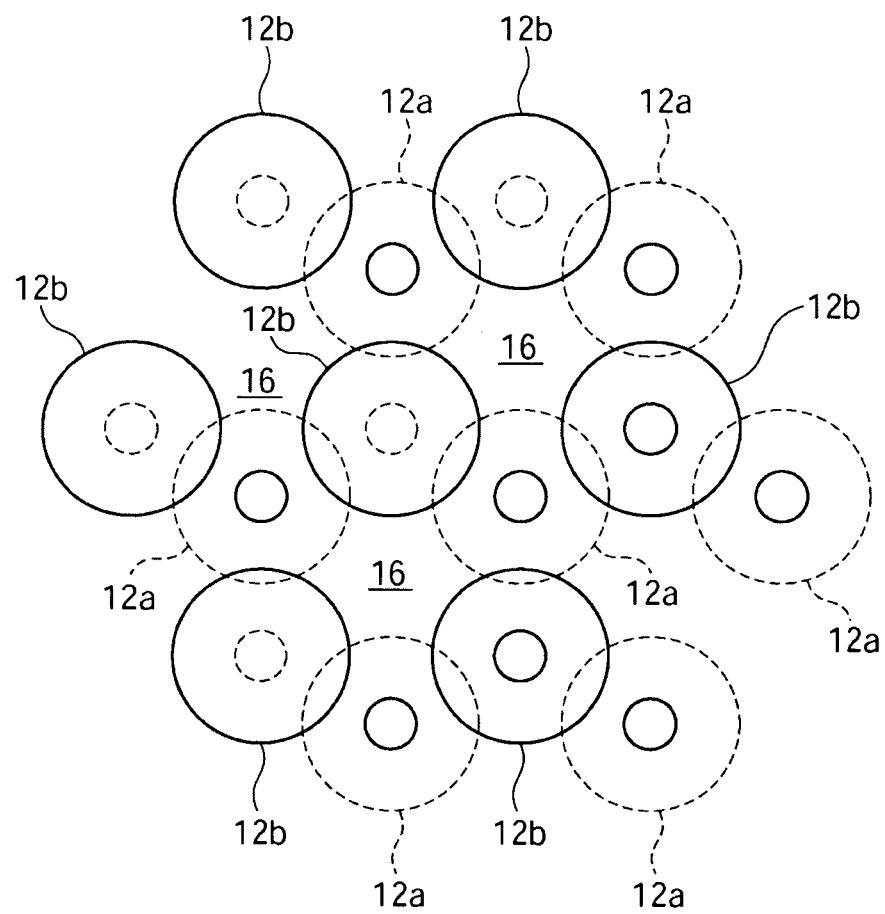
FIG. 20 is a plan view illustrating the structure of the carbon nanotube sheet according to the fourth embodiment of the present invention.
Figure 21:
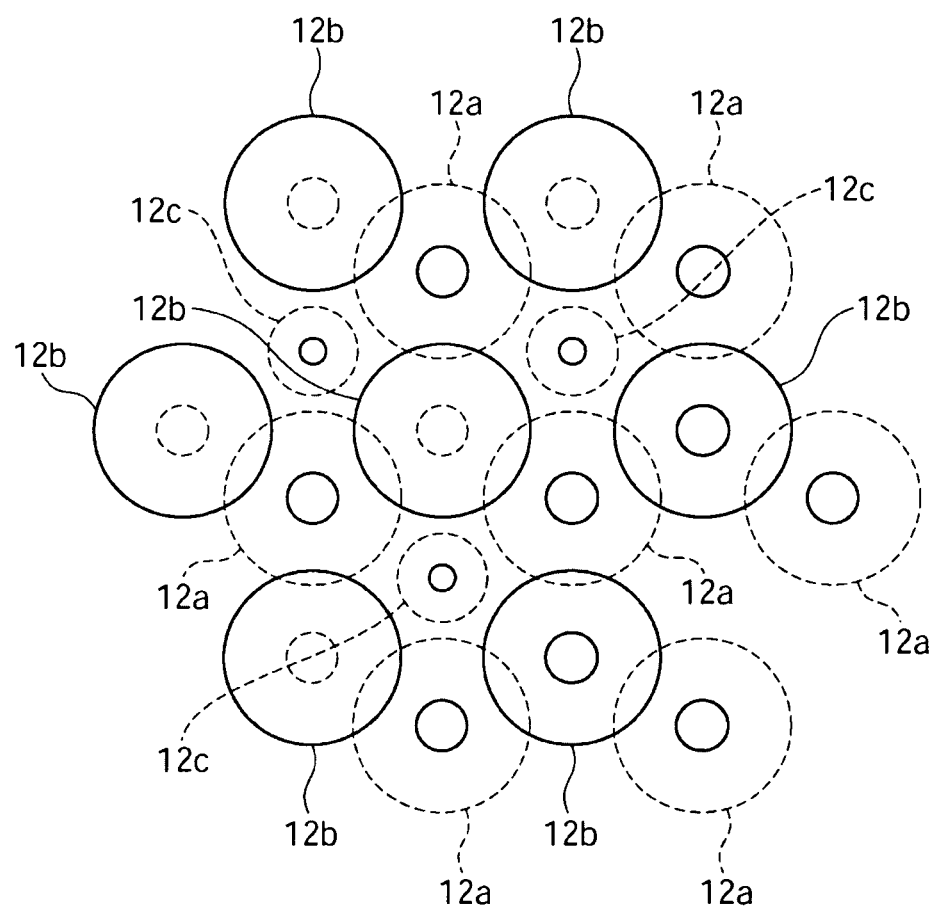
FIG. 21 is a plan view illustrating a structure of the carbon nanotube sheet according to a fifth embodiment of the present invention.
Figure 22A:
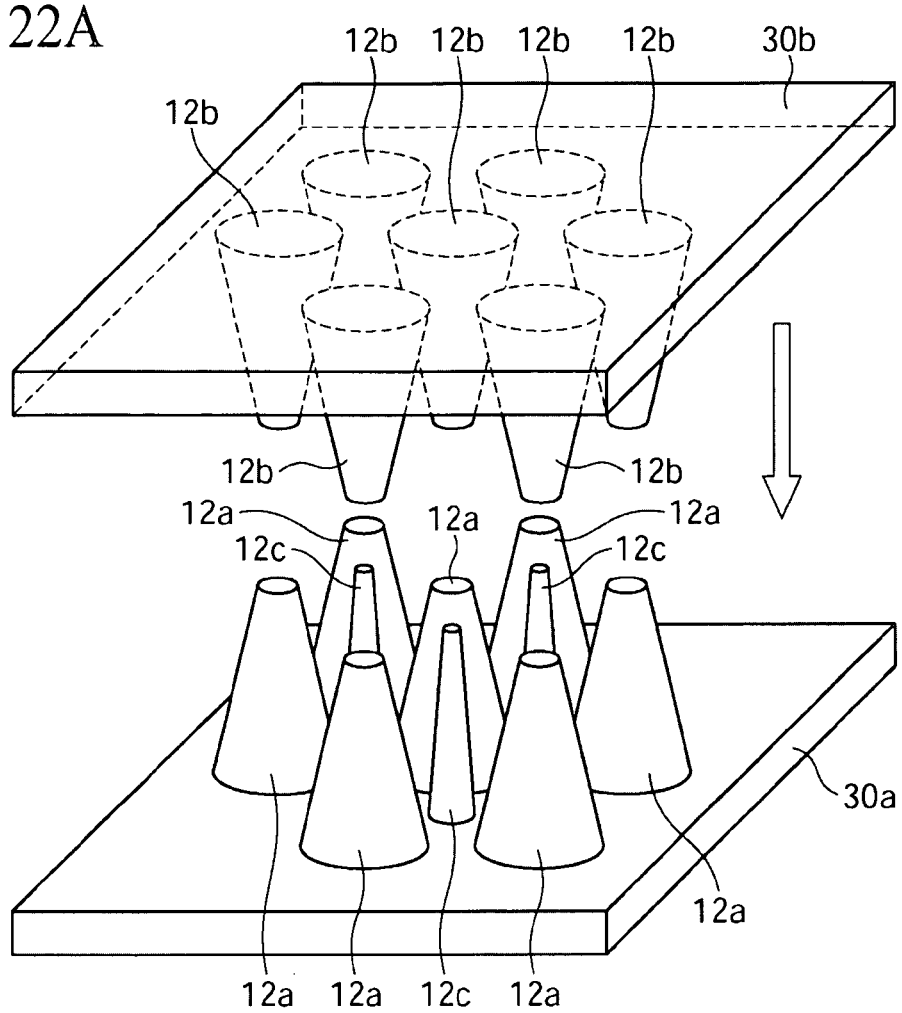
FIGS. 22A-22B are views illustrating a method of manufacturing the carbon nanotube sheet according to the fifth embodiment of the present invention.
Figure 22B:
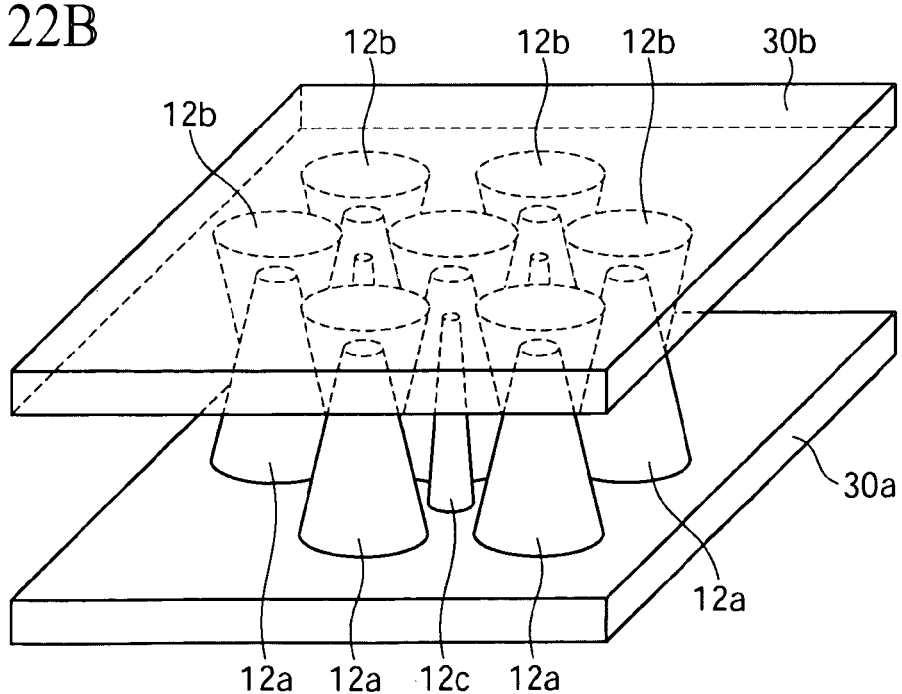

FIG. 20 is a plan view illustrating the structure of the carbon nanotube sheet according to the fourth embodiment. FIG. 21 is a plan view illustrating a structure of the carbon nanotube sheet according to the present embodiment. FIGS. 22A-22B are views illustrating the method of manufacturing the carbon nanotube sheet according to the present embodiment.

In the carbon nanotube sheet and the method of manufacturing the same according to the fourth embodiment, the two substrates 30a, 30b having the circular regions for the carbon nanotube bundles 12a, 12b formed in the close-packed type arrangement are bonded to each other to thereby improve the surface density of the carbon nanotubes. In this case, as illustrated in FIG. 20, the plane layout of the carbon nanotube bundles 12a, 12b after bonded has regions 16 where the carbon nanotube bundles 12a, 12b are not arranged. More carbon nanotube bundles are arranged in these regions 16, whereby the surface density of the carbon nanotubes can be further improved.

FIG. 21 illustrates the plane layout of the carbon nanotube bundles 12a, 12b and carbon nanotube bundles 12c arranged further in the regions 16 of the carbon nanotube sheet according to the present embodiment. The diameter of the carbon nanotube bundles corresponds to the areas of the regions 16 and is different from the diameters of the carbon nanotube bundles 12a, 12b.

Thus, the surplus gaps which cannot be filled by the carbon nanotube bundles 12a, 12b are filled by the carbon nanotube bundles 12c, whereby the surface density of the carbon nanotubes can be further improved, which leads to the improvement of the thermal conductivity and electric conductivity of the carbon nanotube sheet.

The carbon nanotube bundles 12c can be formed on the substrate side 30a concurrently with forming the carbon nanotube bundles 12a as exemplified in FIGS. 22A and 22B. Otherwise, all the carbon nanotube bundles 12c may be formed on the substrate 30b side, or the carbon nanotube bundles 12c may be formed on the substrate 30a side and the substrate 30b side.

The present embodiment is explained by means of the carbon nanotube sheet according to the fourth embodiment, in which the regions for the carbon nanotube bundles 12a, 12b to be formed in are close-packed type arrangement, but the layout the method according to the present embodiment is applicable to is not limited to this. When surplus gaps which cannot be filled by the carbon nanotube bundles 12a formed on the substrate 30a and the carbon nanotube bundles 12b formed on the substrate 30b are generated, the carbon nanotube bundles 12c may be additionally arranged so as to fill the gaps.

As described above, according to the present embodiment, the carbon nanotube bundles for filling surplus gaps are arranged in addition to the carbon nanotube bundles having a smaller diameter on the side of one surface and the carbon nanotube bundles having a smaller diameter on the side of the other surface, whereby the surface density of the carbon nanotubes can be further increased. Thus, the thermal conductivity and/or the electrical conductivity of the carbon nanotube sheet can be drastically improved.

A Sixth Embodiment

The carbon nanotube sheet and the method of manufacturing the same according to a sixth embodiment will be explained with reference to FIG. 23. The same members of the present embodiment as those of the carbon nanotube sheet and the method of manufacturing the same according to the first to the fifth embodiments illustrated in FIGS. 1A to 22B are represented by the same reference numbers not to repeat or to simplify their explanation.

Figure 23:
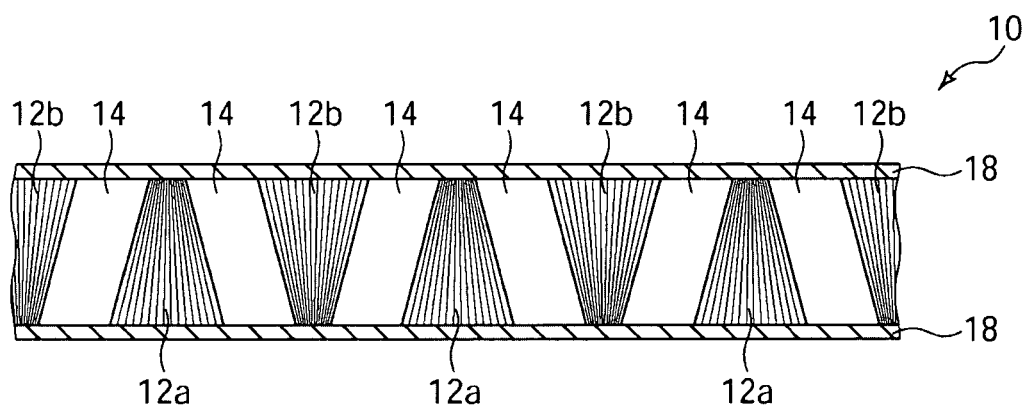
FIG. 23 is a diagrammatic sectional view illustrating a structure of the carbon nanotube sheet according to a sixth embodiment of the present invention.

FIG. 23 is a diagrammatic sectional view illustrating a structure of the carbon nanotube sheet according to the present embodiment.

The carbon nanotube sheet 10 according to the present embodiment is the same as the carbon nanotube sheet according to the fourth and the fifth embodiments in that the tapered carbon nanotube bundles 12a, 12b are formed in the filling layer 14. The carbon nanotube sheet 10 further includes coating film 18 on both surfaces thereof, connected to the ends of the carbon nanotube bundles 12a, 12b.

The coating film 18 provided on both surfaces of the sheet is not especially limited as long as the coating film 18 is formed of a material whose thermal conductivity is higher than that of the material forming the filling layer 14. When the carbon nanotube sheet 10 is used for electric conduction, a material having electric conductivity, e.g., a metal, an alloy or others can be used. As the constituent material of the coating film 18, copper (Cu), nickel (Ni), gold (Au) or others, can be used. The coating film 18 may not have essentially a single layer structure and may have a two-layer structure, or a three- or more-layer structure, e.g., the layer structure of titanium (Ti) and gold (Au).

The film thickness of the coating film 18 is not especially limited. Preferably, the film thickness of the coating film 18 is suitably decided, depending on characteristics required of the carbon nanotube sheet 10 and a constituent material of the coating film 18.

The coating film 18 of high thermal conductivity is provided, whereby the contact area of the carbon nanotube sheet 10 with respect to a mounted body (a radiator or a heater) can be increased with respect to the carbon nanotube sheet 10 without the coating film 18. Thus, the thermal contact resistance between the carbon nanotube bundles 12a, 12b and a mounted body is deceased, and the thermal conductivity of the carbon nanotube sheet 10 can be increased. In using the carbon nanotube sheet 10 as an electric conductive sheet, the electric conductivity can be increased.

The coating film 18 can be formed by, e.g., sputtering method after the step illustrated in FIG. 19B of the method of manufacturing the carbon nanotube sheet according to, e.g., the fourth embodiment. The coating film 18 of the layer film of, e.g., a 10 nm-thickness titanium (Ti) film and, e.g., a 50 nm-thickness gold (Au) film can be used.

As described above, according to the present embodiment, the coating film of a high thermal conductive material is formed on both surfaces of the sheet in contact with the ends of the carbon nanotube bundles, whereby the thermal contact resistance and the contact resistance between the sheet and a mounted body can be drastically decreased. Thus, the thermal conductivity and the electric conductivity of the carbon nanotube sheet can be improved.

A Seventh Embodiment

The carbon nanotube sheet and the method of manufacturing the same according to a seventh embodiment will be explained with reference to FIGS. 24 to 25D. The same members of the present embodiment as those of the carbon nanotube sheet and the method of manufacturing the same according to the first to the sixth embodiments illustrated in FIGS. 1A to 23 are represented by the same reference numbers not to repeat or to simplify their explanation.

Figure 24:
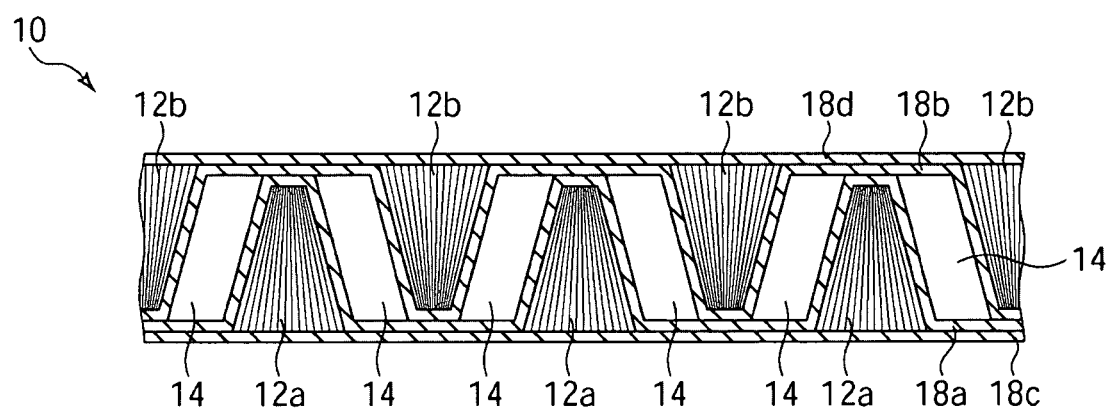
FIG. 24 is a diagrammatic sectional view illustrating a structure of the carbon nanotube sheet according to a seventh embodiment of the present invention.

FIG. 24 is a diagrammatic sectional view illustrating a structure of the carbon nanotube sheet according to the present embodiment. FIGS. 25A-25D are views illustrating a method of manufacturing the carbon nanotube sheet according to the present embodiment.

First, the structure of the carbon nanotube sheet according to the present embodiment will be explained with reference to FIG. 24.

The carbon nanotube sheet 10 according to the present embodiment is the same as the carbon nanotube sheet according to the fourth and the fifth embodiments in that the tapered carbon nanotube bundles 12a, 12b are formed in the filling layer 14. The carbon nanotube sheet 10 according to the present embodiment further includes a coating film 18a formed along the surfaces of the carbon nanotube bundles 12a, a coating film 18b formed along the surfaces of the carbon nanotube bundles 12b, a coating film 18c formed entirely on one surface of the sheet and a coating film 18d formed entirely on the other surface of the sheet.

The coating films 18a, 18b, 18c, 18d are formed of a material whose thermal conductivity is higher than the constituent material of the filling layer 14, as is the coating film 18 of the sixth embodiment. When the carbon nanotube sheet 10 is used in electric conduction use, the coating films are formed of an electric conductive material.

The coating films 18a, 18b, 18c, 18d are provided, whereby the contact area of the carbon nanotube sheet 10 with respect to a mounted body can be increased in comparison with that of the carbon nanotube sheet 10 without the coating film 18. Thus, the thermal contact resistance between the carbon nanotube bundles 12a, 12b with the mounted body is decreased, ad the thermal conductivity of the carbon nanotube sheet 10 can be increased. When the carbon nanotube sheet 10 is used as the conductive sheet, the electric conductivity can be increased.

Next, the method of manufacturing the carbon nanotube sheet according to the present embodiment will be explained with reference to FIGS. 25A to 25D.

Figure 25A:
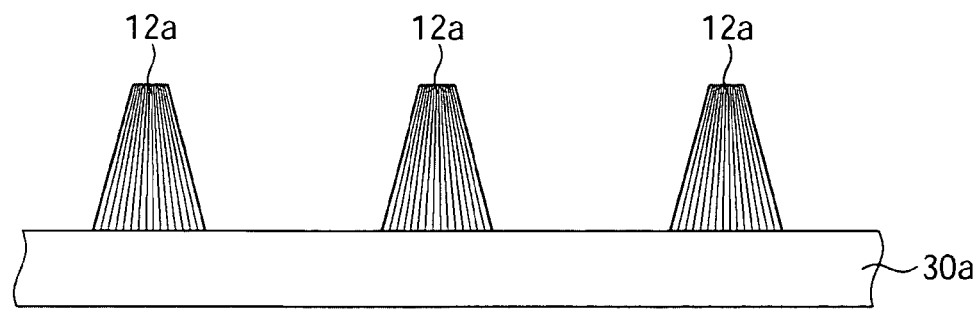
FIGS. 25A-25D are views illustrating a method of manufacturing the carbon nanotube sheet according to the seventh embodiment of the present invention.

First, in the same way as in the method of manufacturing the carbon nanotube sheet according to, e.g., the fourth embodiment illustrated in FIGS. 17A to 17C, the tapered carbon nanotube bundles 12a are formed over the substrate 30a (FIG. 25A).

Figure 25B:
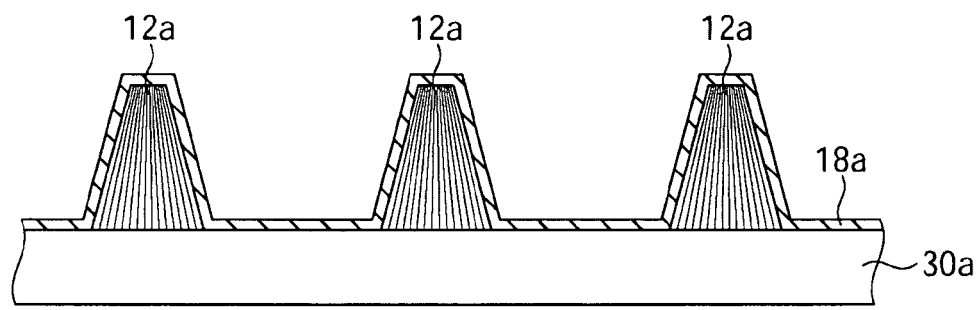

Next, a 10 nm-thickness titanium (Ti) film, for example, and a 50 nm-thickness gold (Au) film, for example, are deposited on the entire surface by, e.g., sputtering method to form the coating film 18a of the layer film of Au/Ti (FIG. 25B).

In the same way, over the substrate 30b, tapered carbon nanotube bundles 12b and the coating film 18b are formed.

Figure 25C:
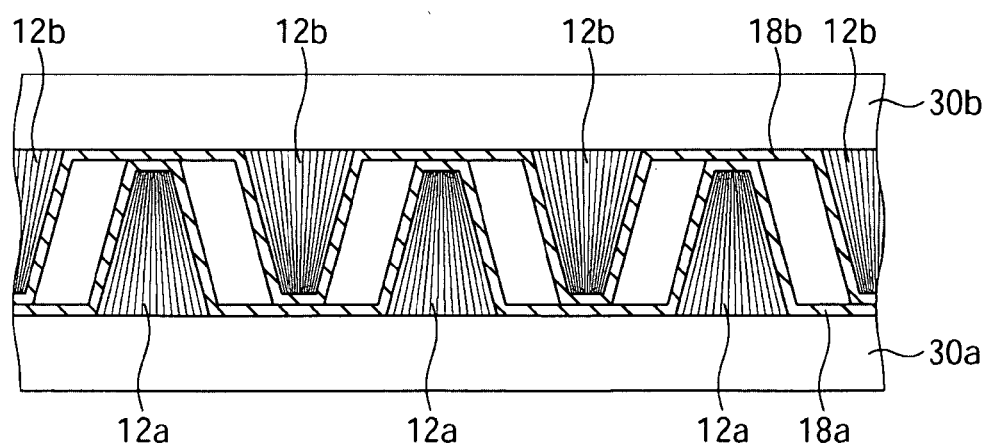
Figure 25D:
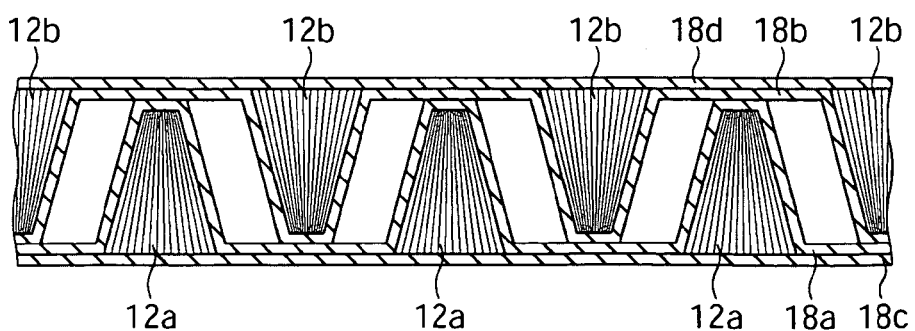

Next, in the same way as in the method of manufacturing the carbon nanotube sheet according to, e.g., the fourth embodiment illustrated in FIGS. 18A and 18B, the substrate 30a and the substrate 30b are bonded to each other (FIG. 25C).

At this time, preferably, at least the surfaces of the coating films 18a, 18b are formed of a material which can be hot-press bonded to each other (e.g., gold). A pressure is applied to the substrate 30a and the substrate 30b while heating the substrates, whereby the coating films 18a, 18b can be hot-press bonded with each other at the upper ends of the carbon nanotube bundles 12a, 12b, and the connection between the coating films 18a, 18b can be ensured.

Then, the filling material to be the filling layer 14 is buried by potting method between the substrate 30a and the substrate 30b to thereby fill the filling layer 14 between the carbon nanotube bundles 12a, 12b. At this time, the ends of the carbon nanotube bundles 12a, 12b, which are in direct contact with the substrates 30a, 30b, are never coated with the filling layer 14. The effect of preventing the cohesion of the carbon nanotubes is the same as in the first embodiment.

Then, in the same way as in the method of manufacturing the carbon nanotube sheet according to, e.g., the first embodiment, the substrate 30a, 30b are peeled.

Next, in the same way as in the method of manufacturing the carbon nanotube sheet according to, e.g., the sixth embodiment, a 10 nm-thickness titanium (Ti) film, for example, and a 50 nm-thickness gold (Au) film, for example, are deposited on both surfaces of the sheet by, e.g., sputtering method. Thus, the coating films 18c, 18d of the layer film of Au/Ti are formed (FIG. 25D).

Thus, the carbon nanotube sheet 10 according to the present embodiment is completed.

As described above, according to the present embodiment, on both surfaces of the sheet, the coating films of a material of high thermal conductivity are formed in contact with the ends of the carbon nanotube bundles, whereby the thermal contact resistance and the electric contact resistance between the sheet and a mounted body can be drastically decreased. Thus, the thermal conductivity and electric conductivity of the carbon nanotube sheet can be improved.

An Eighth Embodiment

The electronic instrument according to a eighth embodiment will be explained with reference to FIG. 26.

Figure 26:
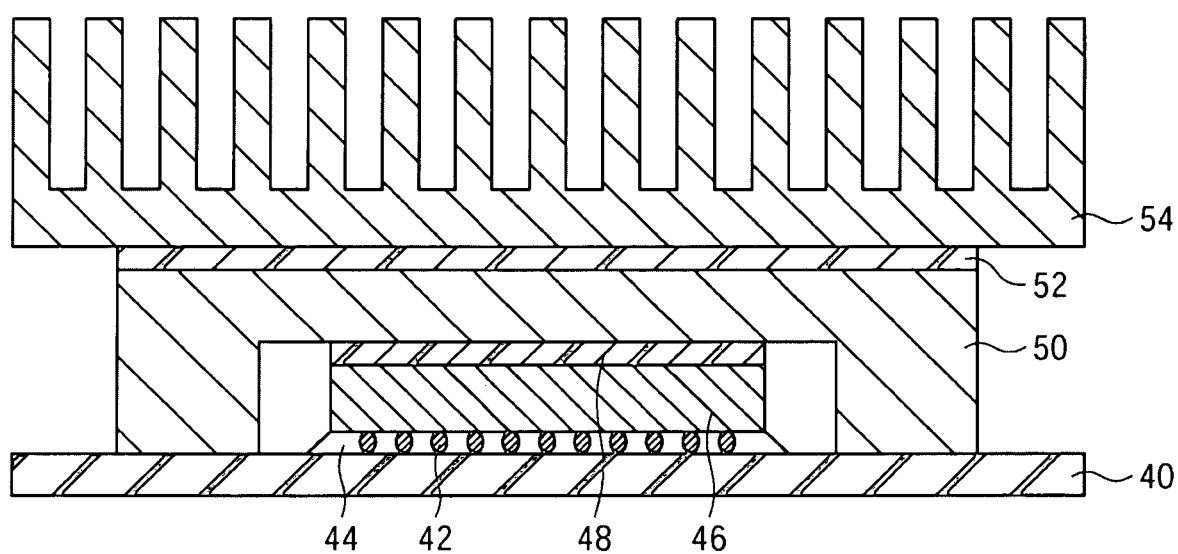
FIG. 26 is a diagrammatic sectional view illustrating a structure of the electronic instrument according to an eighth embodiment of the present invention.

FIG. 26 is a diagrammatic sectional view illustrating a structure of the electronic instrument according to the present embodiment.

In the present embodiment, an electronic instrument using the carbon nanotube sheet according to the first to the seventh embodiments as a thermal conductive sheet will be explained.

Over the circuit board 40 of, e.g., a multi-level interconnection substrate, a semiconductor element 46, such as a CPU, is mounted. The semiconductor element 46 is electrically connected to the circuit board 40, and an underfill 44 is filled between the circuit board 40 and the semiconductor element 46.

Over the semiconductor element 46, a heat spreader 50 for diffusing heat from the semiconductor element 46 is formed, covering the semiconductor element 46. Between the semiconductor element 46 and the heat spreader 50, the carbon nanotube sheet 52 is formed.

Over the heat spreader 50, a heat sink 54 for radiating heat conducted to the heat spreader is formed. Between the heat spreader 50 and the heat sink 54, the carbon nanotube sheet 52 is formed.

As described above, in the electronic instrument according to the present embodiment, the carbon nanotube sheets 48, 52 are disposed respectively between the semiconductor element 46 and the heat spreader 50 and between the heat spreader 50 and the heat sink 54.

As described in the first to the seventh embodiments, the disclosed carbon nanotube sheets have the carbon nanotube bundles 12 oriented vertically to the surface of the sheet, and has very high vertical thermal conductivity.

The disclosed carbon nanotube sheets are used as the thermal conductive sheets formed between the semiconductor element 46 and the heat spreader 50 and between the heat spreader 50 and the heat sink 54, whereby the heat generated by the semiconductor element 46 can be conducted effectively to the heat spreader 50 and the heat sink 54, and the heat radiating efficiency can be improved. Thus, the reliability of the electronic instrument can be improved.

As described above, according to the present embodiment, the carbon nanotube sheet comprising the carbon nanotube bundles oriented in the direction of thickness of the sheet is disposed between the semiconductor element and the heat spreader and between the heat spreader and heat sink, whereby the thermal conductivity between them can be large improved. Thus, the heat radiating efficiency of radiating the heat generated by the semiconductor element can be improved, and the reliability of the electronic instrument can be improved.

A Ninth Embodiment

The electronic instrument according to a ninth embodiment will be explained with reference to FIG. 27.

Figure 27:
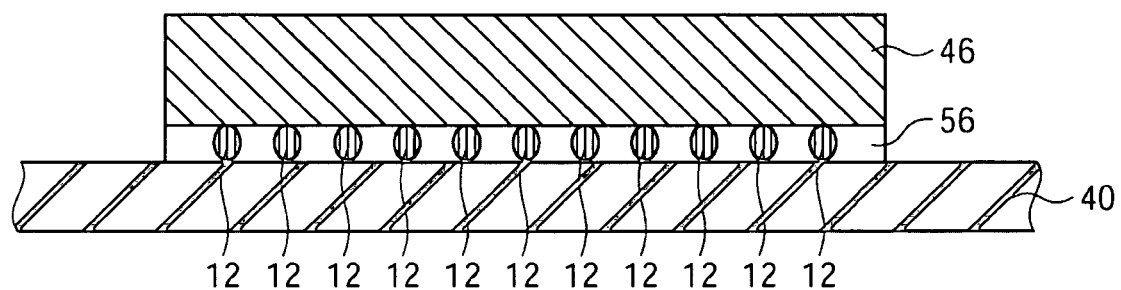
FIG. 27 is a diagrammatic sectional view illustrating a structure of the electronic instrument according to a ninth embodiment of the present invention.

FIG. 27 is a diagrammatic sectional view illustrating a structure of the electronic instrument according to the present embodiment.

In the present embodiment, an electronic instrument using the carbon nanotube sheet according to the first to the fifth embodiments as the vertical interconnecting sheet will be explained.

Over the circuit board 40 of, e.g., a multi-level interconnection substrate, a semiconductor element 46 of, e.g., a CPU is mounted. Between the circuit board 40 and the semiconductor element 46, the carbon nanotube sheet 56 is formed. The circuit board 40 and the semiconductor element 46 are electrically connected to each other via the carbon nanotube bundles 12 of the carbon nanotube sheet 56.

As described above, in the electronic instrument according to the present embodiment, the carbon nanotube sheet 56 is disposed between the circuit board 40 and the semiconductor element 46.

As described in the first to the seventh embodiments, the disclosed carbon nanotube sheets include the carbon nanotube bundles 12 oriented vertical to the film surface of the sheet and having the ends thereof exposed on both surfaces of the sheet. The carbon nanotube is also an electric conductor which is used as an interconnecting material.

Accordingly, the disclosed carbon nanotube sheets are used as the vertical interconnecting sheet formed between the circuit board 40 and the semiconductor element 46, whereby the circuit board 40 and the semiconductor device 46 can be electrically connected to each other.

As described above, according to the present embodiment, the disclosed carbon nanotube sheet having the carbon nanotube bundles oriented in the direction of film thickness of the sheet is disposed between the circuit board and the semiconductor element, whereby both can be electrically connected to each other.

A Tenth Embodiment

The electronic instrument according to a tenth embodiment will be explained with reference to FIG. 28.

Figure 28:
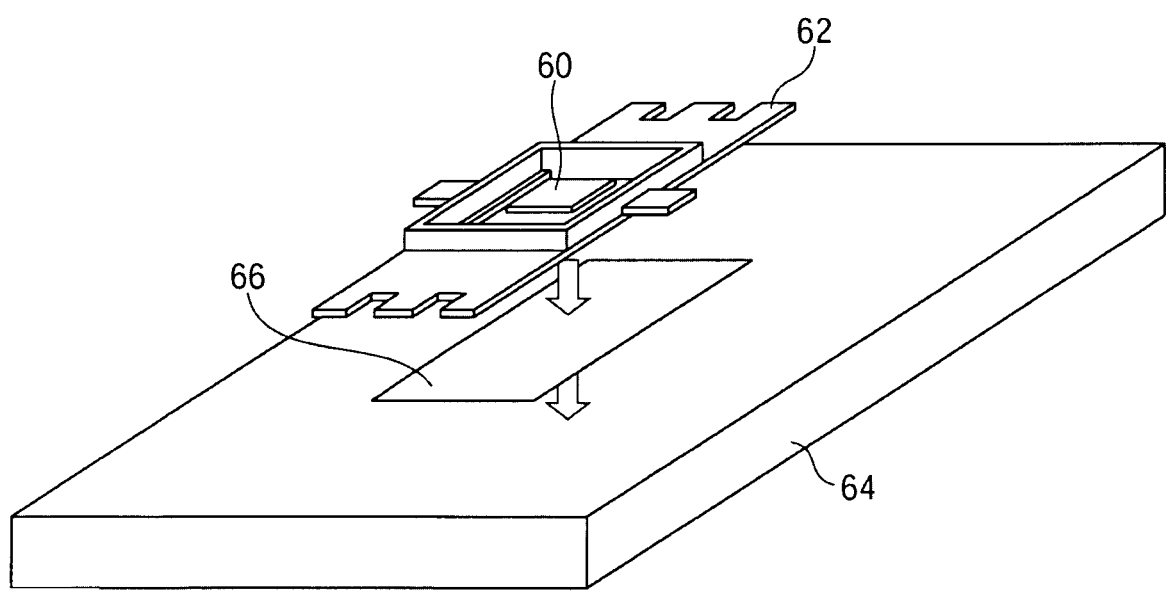
FIG. 28 is a perspective view illustrating a structure of the electronic instrument according to a tenth embodiment of the present invention.

FIG. 28 is a diagrammatic sectional view illustrating a structure of the electronic instrument according to the present embodiment.

In the present embodiment, an electronic instrument including the carbon nanotube sheet according to the first to the seventh embodiments used a thermal conductive sheet functioning also as an electrically conductive sheet will be explained.

As illustrated in FIG. 28, an HPA (High Power Amplifier) 60 used in radio communication stations is incorporated in a package 62 and is connected to a heat sink 64 on the underside of the package 62. Heat generated by the HPA 60 is radiated to the heat sink 64 through the underside of the package 62. Package 62 is also used as the electric ground and must be electrically connected to the heat sink 64. For the connection between the package 62 and the heat sink 64, it is preferable that a material having a good electric and thermal conductivity is used.

In the junction between the package 62 and the heat sink 64, as illustrated in FIG. 28, the carbon nanotube sheet 66 is used, whereby the package 62 and the heat sink 64 can be electrically connected to each other. Heat generated by the HPA 60 can be efficiently conducted to the heat sink 64, whereby the heat radiating efficiency can be increased. Thus, the reliability of the electronic instrument can be improved.

As described above, according to the present embodiment, the carbon nanotube sheet having the carbon nanotube bundles oriented in the direction of film thickness of the sheet is disposed between the package of the HPA and the heat sink, whereby the thermal conductivity between them can be largely increased. Thus, the thermal conductive efficiency of the heat generated by the HPA can be increased. Thus, the reliability of the electronic instrument can be improved. The HPA and the heat sink as the ground can be also electrically connected to each other.

Modified Embodiments

The present invention is not limited to the above-described embodiments and can cover other various modifications.

For example, in the above-described amendments, as the examples of the sheet structure using the plurality of bundles of linear structures of carbon atoms, the carbon nanotube sheet using the plurality of carbon nanotube bundles are disclosed, but the sheet structure using the plurality of bundles of linear structures of carbon atoms is not limited to this. The linear structures of carbon atoms are applicable widely to the sheet structure. The linear structures of carbon atoms are, other than the carbon nanotubes, carbon nanowires, carbon rods, carbon fibers. These linear structures are different from the carbon nanotubes in size but are the same as the carbon nanotubes. These linear structures are also applicable to the sheet structure.

In the fourth to the seventh embodiments, two substrates with the tapered carbon nanotube bundles formed on are bonded to each other to form the carbon nanotube sheet, but it is not essentially necessary that the carbon nanotube bundles 12a, 12b are tapered. In these embodiments, the carbon nanotube bundles are tapered so as to improve the surface density of the carbon nanotube. When the sufficient properties can be obtained without tapering the carbon nanotube bundles, it is not essentially necessary that the carbon nanotube bundles 12a, 12b are tapered. It is not essentially necessary that the both of carbon nanotube bundles 12a, 12b are tapered. One of the carbon nanotube bundles 12a and the carbon nanotube bundles 12b may be tapered.

In the sixth and the seventh embodiments, the coating film having the thermal conductivity higher than the filling material is formed on the surfaces of the carbon nanotube sheet according to the fourth embodiment. The coating film may be also formed on the surfaces of the carbon nanotube sheets according to the first to the third embodiments.

The constituent material and the manufacturing conditions described in the above-described embodiments are not essential and can be changed suitably for purposes.

The uses of the carbon nanotube sheet described in the above embodiments are not essential. The disclosed carbon nanotube sheets are applicable, as the thermal conductive sheet, to, e.g., radiation sheets of CPUs, HPSs for radio communication stations, HPAs for radio communication terminals, high power switches for electric cars, servers, personal computers, etc. The high allowable current density of the carbon nanotube sheet can be utilized to be applied to the vertical interconnecting sheets and various applications using the vertical interconnecting sheets.

All examples and conditional language recited herein are intended for pedagogical purpose to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alternations could be made hereto without departing from the spirit and scope of the invention.

What is claimed is:

1. A sheet structure comprising:
   a plurality of carbon nanotube bundles, each of the carbon nanotube bundles comprising a plurality of carbon nanotubes, the plurality of carbon nanotubes being arranged, spaced from each other;
   a filling layer formed of an organic filling material and formed in gaps between the plurality of carbon nanotube bundles and in gaps between the carbon nanotubes in the respective carbon nanotube bundles, and supporting the plurality of carbon nanotube bundles;
   a first coating film formed over a first surface of the filling layer so as to be in contact with respective one ends of the plurality of carbon nanotube bundles and formed of a material having a higher thermal conductivity than the organic filling material; and
   a second coating film formed over a second surface of the filling layer so as to be in contact with respective other ends of the plurality of carbon nanotube bundles and formed of a material having a higher thermal conductivity than the organic filling material.

2. The sheet structure according to claim 1, wherein each of the plurality of carbon nanotubes forming the plurality of carbon nanotube bundles is oriented in the same direction.

3. A sheet structure comprising:
a plurality of carbon nanotube bundles, each of the carbon nanotube bundles comprising a plurality of carbon nanotubes, the plurality of carbon nanotubes being arranged, spaced from each other;
a filling layer formed of an organic filling material and formed in gaps between the plurality of carbon nanotube bundles and in gaps between the carbon nanotubes in the respective carbon nanotube bundles, and supporting the plurality of carbon nanotube bundles;
a first coating film formed over a first surface of the filling layer so as to be in contact with respective one ends of the plurality of carbon nanotube bundles and formed of a material having a higher thermal conductivity than the organic filling material; and
a second coating film formed over a second surface of the filling layer so as to be in contact with respective other ends of the plurality of carbon nanotube bundles and formed of a material having a higher thermal conductivity than the organic filling material,
the plurality of carbon nanotube bundles comprising a first group of the carbon nanotube bundles which are tapered with ends on one surface being smaller than ends on the other surface and a second group of the carbon nanotube bundles which are tapered with ends on said other surface being smaller than ends of said one surface.

4. The sheet structure according to claim 3, wherein the carbon nanotube bundles of the first group and the carbon nanotube bundles of the second group are respectively arranged so as to engage with each other and fill gaps.

5. The sheet structure according to claim 4, wherein the carbon nanotube bundles of the first group and the carbon nanotube bundles of the second group are arranged in a hexagonal close-packed type arrangement, the plurality of carbon nanotube bundles further comprises a third group of the carbon nanotube bundles smaller than the carbon nanotube bundles of the first group and the carbon nanotube bundles of the second group, and formed in gaps between the carbon nanotube bundles of the first group and the carbon nanotube bundles of the second group.

6. The sheet structure according to claim 3, further comprising:
a third coating film formed on surfaces of the carbon nanotube bundles of the first group and formed of a material having a higher thermal conductivity than the organic filling material; and
a fourth coating film formed on surfaces of the carbon nanotube bundles of the second group and formed of a material having a higher thermal conductivity than the organic filling material.

7. The sheet structure according to claim 3, wherein each of the plurality of carbon nanotubes forming the plurality of carbon nanotube bundles is oriented in the same direction.

8. A method of manufacturing a sheet structure comprising:
forming a catalytic metal film in a plurality of regions of a substrate, which are spaced from each other;
forming a plurality of carbon nanotube bundles comprising a plurality of carbon nanotubes in the respective plurality of regions by growing carbon nanotubes with the catalytic metal film as a catalyst;
filling an organic filling material between the carbon nanotube bundles and between the carbon nanotubes in the respective carbon nanotube bundles to form a filling layer of the organic filling material;
removing the substrate;
forming a first coating film formed of a material having a higher thermal conductivity than the organic filling material over a first surface of the filling layer so as to be in contact with respective one ends of the plurality of carbon nanotube bundles; and
forming a second coating film formed of a material having a higher thermal conductivity than the organic filling material over a second surface of the filling layer so as to be in contact with respective other ends of the plurality of carbon nanotube bundles.

9. The method of manufacturing a sheet structure according to claim 8, wherein
in forming the filling layer, the organic filling material is applied by spin coating, and
a viscosity and/or a rotation number for applying the organic filling material are controlled so that the ends of the carbon nanotube bundles are exposed.

10. A method of manufacturing a sheet structure comprising:
forming on a first substrate first carbon nanotube bundles in respective plural regions spaced from each other;
forming on the first substrate with the first carbon nanotube bundles formed on a first coating film formed of a material having a higher thermal conductivity than an organic filling material;
forming on a second substrate second carbon nanotube bundles in respective plural regions spaced from each other;
forming on the second substrate with the second carbon nanotube bundles formed on a second coating film formed of a material having a higher thermal conductivity than the organic filling material;
bonding the first substrate and the second substrate to each other with a surface of the first substrate with the first carbon nanotube bundles and the first coating film formed on and a surface of the second substrate with the second carbon nanotube bundles and the second coating film formed on opposed to each other to thereby engage the first carbon nanotube bundles and the second carbon nanotube bundles with each other and to fill gaps;
after bonding the first substrate and the second substrate, filling the organic filling material in gaps between the first carbon nanotube bundles and the second carbon nanotube bundles and in gaps between the carbon nanotubes in the first carbon nanotube bundles and the second carbon nanotube bundles to thereby form a filling layer; and
removing the first substrate and the second substrate.

11. The method of manufacturing a sheet structure according to claim 10, further comprising:
after forming the first carbon nanotube bundles, immersing the first carbon nanotube bundles in a liquid and drying to thereby taper the first carbon nanotube bundles upwardly decreasingly; and
after forming the second carbon nanotube bundles, immersing the second carbon nanotube bundles in a liquid and drying to thereby taper the second carbon nanotube bundles upwardly decreasingly.

12. The method of manufacturing a sheet structure according to claim 10, further comprising after removing the substrates,
forming on a surface a third coating film formed of a material having a higher thermal conductivity than the organic filling material.

* * * * *